United States Patent
Rayner, Jr.

(10) Patent No.: US 9,695,510 B2
(45) Date of Patent: Jul. 4, 2017

(54) ATOMIC LAYER DEPOSITION APPARATUS AND PROCESS

(75) Inventor: Gilbert Bruce Rayner, Jr., Oakdale, PA (US)

(73) Assignee: Kurt J. Lesker Company, Jefferson Hills, PA (US)

(*) Notice: Subject to any disclaimer, the term of this patent is extended or adjusted under 35 U.S.C. 154(b) by 107 days.

(21) Appl. No.: 13/453,488

(22) Filed: Apr. 23, 2012

(65) Prior Publication Data
US 2012/0269968 A1 Oct. 25, 2012

Related U.S. Application Data

(60) Provisional application No. 61/517,554, filed on Apr. 21, 2011.

(51) Int. Cl.
*C23C 16/452* (2006.01)
*C23C 16/455* (2006.01)
(Continued)

(52) U.S. Cl.
CPC ...... *C23C 16/45544* (2013.01); *C23C 16/452* (2013.01); *C23C 16/4558* (2013.01);
(Continued)

(58) Field of Classification Search
CPC ........ C23C 16/452; C23C 16/45502–16/4551; C23C 16/45517; C23C 16/45519;
(Continued)

(56) References Cited

U.S. PATENT DOCUMENTS 4,989,541 A * 2/1991 Mikoshiba et al. ... 118/723 ME
5,192,370 A * 3/1993 Oda et al. ................. 118/723 R
(Continued)

FOREIGN PATENT DOCUMENTS

EP 909836 A2 * 4/1999
JP 11312674 A * 11/1999
(Continued)

OTHER PUBLICATIONS

John F. O'Hanlon. A User Guide to Vacuum Technology, 3rd Edition. Chapter 2: Gas Properties. 2003. John Wiley & Sons, Inc. pp. 9-24.*
(Continued)

*Primary Examiner* — Jeffrie R Lund
*Assistant Examiner* — Stanislav Antolin
(74) *Attorney, Agent, or Firm* — The Webb Law Firm

(57) ABSTRACT

An atomic layer deposition apparatus, including: a chamber with an internal volume; a fixture assembly to hold a substrate within the internal volume of the chamber; a plurality of gas injection ports to facilitate the introduction of gas; at least one precursor gas arrangement to introduce precursor gas into the internal volume; and at least one inactive gas dispersion arrangement to introduce inactive gas into the internal volume. The inactive gas dispersion arrangement is in the form of a primary dispersion member configured to concentrically focus the precursor gas towards a surface of the substrate. A modeling system for an atomic layer deposition apparatus is also disclosed.

24 Claims, 20 Drawing Sheets

(51) Int. Cl.
  *C23C 16/52*     (2006.01)
  *H01J 37/32*    (2006.01)

(52) U.S. Cl.
  CPC .. *C23C 16/45504* (2013.01); *C23C 16/45517* (2013.01); *C23C 16/45519* (2013.01); *C23C 16/45523* (2013.01); *C23C 16/45525* (2013.01); *C23C 16/45536* (2013.01); *C23C 16/45557* (2013.01); *C23C 16/45565* (2013.01); *C23C 16/45574* (2013.01); *C23C 16/52* (2013.01); *H01J 37/32449* (2013.01)

(58) Field of Classification Search
  CPC .. C23C 16/45523–16/45555; C23C 16/45561; C23C 16/45563–16/4558; C23C 16/4408; C23C 16/455; C23C 16/4585; H01L 21/28562; H01L 21/3141; H01L 21/31604–21/31645; C30B 25/14; H01J 37/32431; H01J 37/3244–37/32449; H01J 37/32477–37/32504; H01J 37/32798–37/32908; Y10S 438/935
  USPC .............. 118/715, 723 R, 723 ME, 723 ER, 118/723 IR, 728; 156/345.1, 345.33, 156/345.34, 345.35
  See application file for complete search history.

(56) References Cited

U.S. PATENT DOCUMENTS

| | | | | |
|---|---|---|---|---|
| 5,422,139 | A * | 6/1995 | Fischer | 427/248.1 |
| 5,669,976 | A * | 9/1997 | Yuuki et al. | 118/725 |
| 5,755,886 | A * | 5/1998 | Wang et al. | 118/715 |
| 5,772,770 | A * | 6/1998 | Suda et al. | 118/719 |
| 6,001,267 | A * | 12/1999 | Os et al. | 216/67 |
| 6,050,216 | A | 4/2000 | Szapucki et al. | |
| 6,103,304 | A * | 8/2000 | Mizuno | 118/715 |
| 6,113,700 | A * | 9/2000 | Choi | 118/715 |
| 6,125,788 | A * | 10/2000 | Hills et al. | 156/345.51 |
| 6,143,077 | A * | 11/2000 | Ikeda et al. | 118/715 |
| 6,237,528 | B1 | 5/2001 | Szapucki et al. | |
| 6,508,197 | B1 * | 1/2003 | Omstead et al. | 118/715 |
| 6,579,372 | B2 | 6/2003 | Park | |
| 6,590,344 | B2 * | 7/2003 | Tao et al. | 315/111.21 |
| 6,773,507 | B2 | 8/2004 | Jallepally et al. | |
| 6,902,624 | B2 * | 6/2005 | Seidel et al. | 118/719 |
| 6,916,398 | B2 * | 7/2005 | Chen et al. | 156/345.33 |
| 7,008,484 | B2 | 3/2006 | Yim et al. | |
| 7,104,476 | B2 | 9/2006 | Kim | |
| 7,378,127 | B2 | 5/2008 | Carpenter et al. | |
| 7,427,425 | B2 | 9/2008 | Carpenter et al. | |
| 7,462,245 | B2 * | 12/2008 | Shimizu et al. | 118/726 |
| 7,682,946 | B2 | 3/2010 | Ma et al. | |
| 7,850,779 | B2 | 12/2010 | Ma et al. | |
| 2001/0006095 | A1* | 7/2001 | Snijders | H01L 21/67017 |
| | | | | 156/345.33 |
| 2001/0042512 | A1* | 11/2001 | Xu et al. | 118/723 R |
| 2002/0035962 | A1* | 3/2002 | Sakuma | 118/50.1 |
| 2002/0078893 | A1* | 6/2002 | Os et al. | 118/723 I |
| 2002/0152960 | A1* | 10/2002 | Tanaka et al. | 118/723 R |
| 2003/0198740 | A1* | 10/2003 | Wendling | 427/248.1 |
| 2004/0081607 | A1* | 4/2004 | Hasegawa | B01D 53/68 |
| | | | | 423/240 R |
| 2004/0163761 | A1* | 8/2004 | Strang | 156/345.33 |
| 2004/0187779 | A1 | 9/2004 | Park et al. | |
| 2004/0216671 | A1* | 11/2004 | Carpenter et al. | 118/715 |
| 2005/0003600 | A1* | 1/2005 | Kasai et al. | 438/200 |
| 2005/0252449 | A1* | 11/2005 | Nguyen | C23C 16/0272 |
| | | | | 118/715 |
| 2005/0268856 | A1* | 12/2005 | Miller et al. | 118/729 |
| 2006/0016559 | A1* | 1/2006 | Kobayashi et al. | 156/345.34 |
| 2006/0086319 | A1* | 4/2006 | Kasai | C23C 16/16 |
| | | | | 118/715 |
| 2006/0096540 | A1* | 5/2006 | Choi | 118/724 |
| 2006/0097644 | A1* | 5/2006 | Kono et al. | 315/111.21 |
| 2006/0144334 | A1 | 7/2006 | Yim et al. | |
| 2006/0276037 | A1* | 12/2006 | Lee et al. | 438/681 |
| 2008/0085413 | A1* | 4/2008 | Shimoda et al. | 428/409 |
| 2008/0110400 | A1* | 5/2008 | Satou | H01J 37/32449 |
| | | | | 118/723 VE |
| 2009/0107400 | A1* | 4/2009 | Miya | 118/715 |
| 2009/0250004 | A1* | 10/2009 | Yamada et al. | 118/722 |
| 2010/0279008 | A1* | 11/2010 | Takagi | C23C 16/409 |
| | | | | 427/248.1 |
| 2012/0161405 | A1* | 6/2012 | Mohn | C23C 16/401 |
| | | | | 279/142 |
| 2014/0193977 | A1* | 7/2014 | Kawamata | H01L 21/3065 |
| | | | | 438/710 |
| 2014/0234992 | A1* | 8/2014 | Kubota | H01L 21/76811 |
| | | | | 438/9 |

FOREIGN PATENT DOCUMENTS

| | | | | |
|---|---|---|---|---|
| JP | 2000345349 A | * | 12/2000 | |
| JP | 2008283198 A | * | 11/2008 | |
| JP | WO 2009034898 A1 | * | 3/2009 | ....... C23C 16/45574 |
| JP | WO 2009041282 A1 | * | 4/2009 | ........... C23C 16/409 |
| JP | WO 2011024777 A1 | * | 3/2011 | ........ H01J 37/32357 |
| WO | WO 2009034898 A1 | * | 3/2009 | |

OTHER PUBLICATIONS

John F. O'Hanlon. A User Guide to Vacuum Technology, 3rd Edition. Chapter 3: Gas Flow. 2003. John Wiley & Sons, Inc. pp. 25-56.*

John F. O'Hanlon. A User Guide to Vacuum Technology, 3rd Edition. Appendix B.2 Physical Properties of Gases and Vapors at T = 0 C. 2003. John Wiley & Sons, Inc. p. 467.*

A. Roth. Vacuum Technology. Chapter 3: Gas Flow at Low Pressures. 1973. Israel Atomic Energy Commission. pp. 87-186.*

Walter Umrath, Editor. Fundamentals of Vacuum Technology. Jun. 2007. Oerlikon Leybold Vacuum. Cologne, Germany. pp. 1-197.*

Brochure 08-069, "Atomic Layer Deposition System Platforms," pp. 1-4 Source location: Kurt J. Lesker Company, 2008. http://www.lesker.com/newweb/literature/pdf/08-069_alddepositionsystems.pdf. Available: http://www.lesker.com/. Accessed: Mar. 20, 2015.*

Section 15—Vacuum Systems, "ALD Systems & Components," in Global Vacuum Product Guide, 9th Edition. pp. 15-24 & 25. Source location: Kurt J. Lesker Company, 2009. https://www.lesker.com/newweb/vacuum_systems/pdf/kjlced09_sec15_pages24-25_atomiclayerdepositionsystems.pdf. Available: http://www.lesker.com/. Accessed: Mar. 20, 2015.*

Brochure 10-114, "ALD150LX™ Atomic Layer Deposition System," pp. 1-2. Source location: Kurt J. Lesker Company, 2011. http://www.lesker.com/newweb/literature/pdf/10-114-sy-ds-ald150lx.pdf . Available: http://www.lesker.com/. Accessed: Mar. 20, 2015.*

"KJLC Patent Pending Precursor Focusing Technology (PFT)" in Lesker News Mar. 27, 2012. p. 1. Source location: Kurt J. Lesker Company, 2012. http://www.lesker.com/newweb/news/news_index.cfm?year=2012. Available: http://www.lesker.com/. Accessed: Mar. 20, 2015.*

Ali Foroughi Abari, "Atomic Layer Deposition of Metal Oxide Thin Films on Metallic," Doctoral Thesis. pp. Title, 4 & 24-30. Source location: ERA at the University of Alberta, 2012. https://era.library.ualberta.ca/public/view/item/uuid:8a36423e-c120-4277-bc1c-c19d8051cc43/. Available: https://era.library.ualberta.ca/. Accessed: Mar. 20, 2015.*

"Atomic Layer Deposition (ALD)—General, Technical, & Process Information" at Kurt J. Lesker Company website. p. 1-3. Source location: Kurt J. Lesker Company, 2015. http://www.lesker.com/newweb/vacuum_systems/deposition_systems_ald_overview.cfm. Available: http://www.lesker.com/. Accessed: Mar. 20, 2015.*

E Langereis et al. In situ Spectroscopic Ellipsometry as a Versatile Tool for Studying Atomic Layer Deposition. Mar. 2009. Journal of Physics D: Applied Physics. 42 (2009) 073001 pp. 19.*

(56) References Cited

OTHER PUBLICATIONS

Kai-Erik Elers et al. "Film Uniformity in Atomic Layer Deposition." 2006. Chemical Vapor Deposition. 12 (2006) pp. 13-24.*
N. B. Ballal. "Mass Transfer in Porous Solids under Pulsating Pressure Conditions." ISIJ International vol. 35 (1995) No. 4. pp. 446-448.*
Elers, Kai-Erik, et al., "Film Uniformity in Atomic Layer Deposition," Chemical Vapor Deposition, 2006, pp. 13-24, vol. 12.
O'Hanlon, John F., A User's Guide to Vacuum Technology, Third Edition, 2003, 5 pages, John Wiley & Sons, Inc., Hoboken, New Jersey.
Roth, Alexander, Vacuum Technology: Third, Updated and Enlarged Edition, 1990, 4 pages, Elsevier Science B. V., Amsterdam, The Netherlands.

* cited by examiner

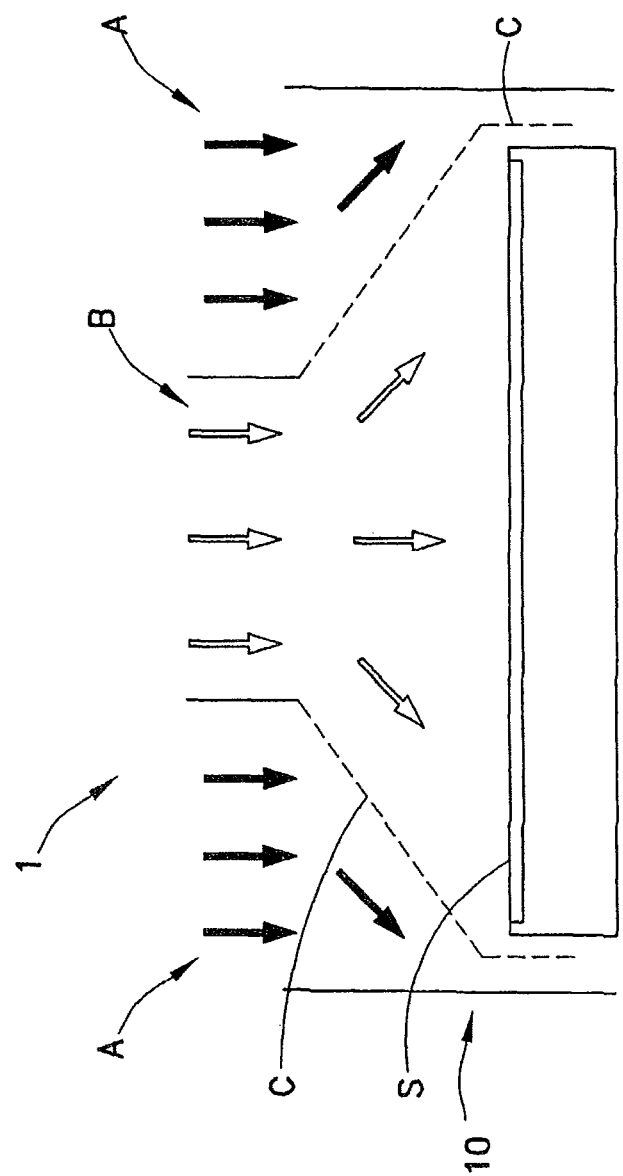

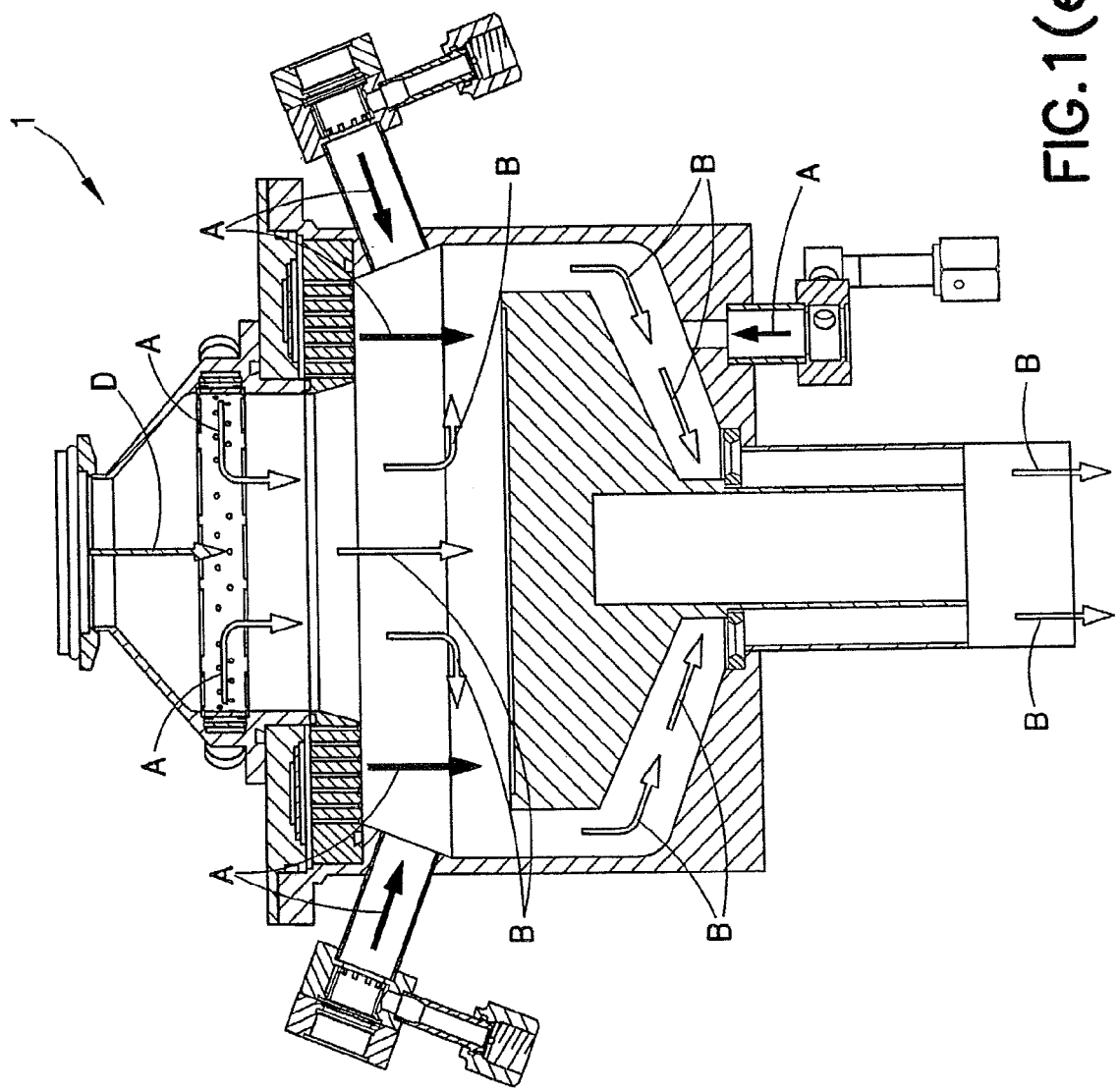

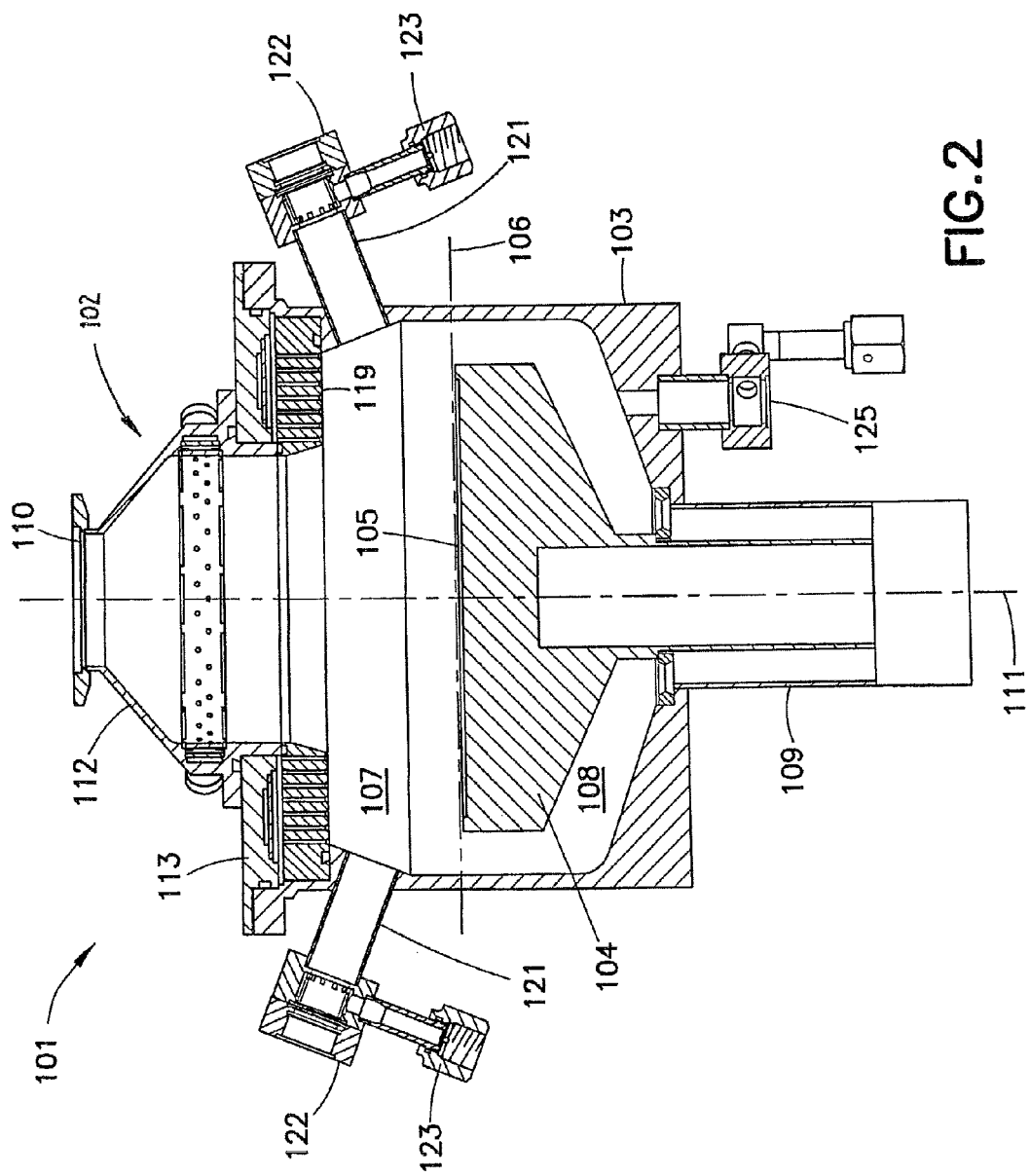

Note: All user inputs are converted to centimeter-grams-seconds (cgs) units for subsequent calculations - results are presented in more appropriate units

Temperature
| | | |
|---|---|---|
| T = | 130 | (C) Process chamber temperature |
| | 403 | (K) 0 C = 273.15 K |

Pressure
| | | |
|---|---|---|
| $P_2$ = | 1.500 | (Torr) Process chamber pressure (downstream pressure) |
| | 2.000E+03 | (Ba) 1 Torr = 1333.2 Ba (Ba = dyne/cm²) |
| $P_1$ = | 1.890 | (Torr) Pressure above primary dispersion member (upstream pressure) |
| | 2.520E+03 | (Ba) |
| $\Delta P$ = | 0.380 | (Torr) Pressure difference = $(P_1 - P_2)$ |
| | 5.199E+02 | (Ba) |
| $\langle P \rangle$ = | 1.695 | (Torr) Average pressure = $(P_1 + P_2)/2$ |
| | 2.260E+03 | (Ba) |
| $\Delta P_2$ = | 0.100 | Process chamber pressure increase during precursor pulsing |
| | 1.333E+02 | |

Flow
| | | |
|---|---|---|
| Φ = | 600 | (sccm) Mass flow rate through primary dispersion member |
| Q = | 11.22 | (Torr·L/s) Throughput through primary dispersion member |
| | 1.495E+07 | (Ba·cm³/s) |

Primary Showerhead Parameters
| | | |
|---|---|---|
| N = | 609 | Number of holes through primary dispersion member |
| d = | 0.050 | (in) Primary dispersion member hole diameter |
| | 0.127 | (cm) |
| L = | 0.630 | (in) Primary dispersion member thickness |
| | 1.60 | (cm) |

Gas Properties
| | | |
|---|---|---|
| $M_1$ (Ar) = | 39.948 | (g/mole) Molar mass (inactive gas) |
| $m_1$ = | 6.6337E-23 | (g) Molecular mass (inactive gas) |
| $\sigma_1$ = | 3.64 | (Å) Molecular diameter (inactive gas) - Ref. 2 (pg. 467) |
| | 3.64E-08 | (cm) |
| $M_2$ (H2O) = | 18.015 | (g/mole) Molar mass (precursor) - Ref. 2 (pg. 467) |
| $m_2$ = | 2.9916E-23 | (g) Molecular mass (precursor) |
| $\sigma_2$ = | 4.60 | (Å) Molecular diameter (precursor) - Ref. 2 (pg. 467) |
| | 4.60E-08 | (cm) |

Fundamental Constants
| | | |
|---|---|---|
| R = | 8.314E+07 | (erg/(K·mole)) Gas constant - Ref. 3 (pg. 28) |
| k = | 1.3805E-16 | (erg/K) Boltzmann constant - Ref. 3 (pg. 30) |
| $N_A$ = | 6.022E+23 | (units/mole) Avogadro's number - Ref. 1 (A-3) |

Instructions
Enter data fields in bold/black (10x)
Adjust P1 (bold/red) to obtain Q(calculated) = Q(actual)
Q(calculated) is in bold/blue
When Q(calculated) = Q(actual) obtain $L_0$, $L_{eff}$ and $L_{eff}/L_0$ (results in bold/blue)

Results
| | | | |
|---|---|---|---|
| Q = | 11.22 | (Torr·L/s) | Throughput - calculated |
| = | 11.22 | (Torr·L/s) | Throughput - actual |
| $L_0$ = | 0.384 | (in) | |
| $L_{eff}$ = | 0.468 | (in) | |
| $L_{eff}/L_0$ = | 1.219 | | |

References
Ref. 1 Fundamentals of Physics, 4th edition, Halliday & Resnick
Ref. 2 A User's Guide to Vacuum Technology, 3rd edition, O'Hanlon
Ref. 3 Vacuum Technology, 3rd edition, Roth

FIG. 16

Appendix B.2 Physical Properties of Gases and Vapors at $T = 0°C$

| Gas | Symbol | MW[a] | Molecular Diameter[b] (nm) | Average Velocity[c] (m·s⁻¹) | Thermal Cond.[a,d] (mJ·s⁻¹·K⁻¹) | Dynamic Viscosity[a,d] (µPa·s) | Diffusion in Air[d,e] (10⁻⁶ m²·s⁻¹) |
|---|---|---|---|---|---|---|---|
| Helium | He | 4.003 | 0.218 | 1197.0 | 142.0 | 18.6 | 58.12 |
| Neon | Ne | 20.183 | 0.259 | 533.0 | 45.5 | 29.73 | 27.63 |
| Argon | Ar | 39.948 | 0.364 | 379.0 | 16.6 | 20.96 | 17.09 |
| Krypton | Kr | 83.8 | 0.416 | 262.0 | 6.81[f] | 23.27 | 13.17 |
| Xenon | Xe | 131.3 | 0.485 | 209.0 | 4.50[g] | 21.9 | 10.60 |
| Hydrogen | H₂ | 2.016 | 0.274 | 1687.0 | 173.0 | 8.35 | 63.4[h] |
| Nitrogen | N₂ | 28.0134 | 0.375 | 453.0 | 24.0 | 16.58 | 18.02 |
| Air | | 28.966 | 0.372 | 445.0 | 24.0 | 17.08 | 18.01 |
| Oxygen | O₂ | 31.998 | 0.361 | 424.0 | 24.5 | 18.9 | 17.8[h] |
| Hydrogen chloride | HCl | 36.46 | 0.446 | 397.0 | 12.76 | 14.25[k] | 14.11 |
| Water vapor | H₂O | 18.0153 | 0.46 | 564.0 | 24.1i | 12.55i | 23.9[a,j] |
| Hydrogen sulfide | H₂S | 34.08 | 0.47[k] | 412.0 | 12.9 | 11.66 | 14.62[k] |
| Nitric oxide | NO | 30.01 | 0.372[k] | 437.0 | 23.8 | 17.8 | 19.3[k] |
| Nitrous oxide | N₂O | 44.01 | 0.47[k] | 361.0 | 15.2 | 13.5 | 13.84[k] |
| Ammonia | NH₃ | 17.03 | 0.443 | 581.0 | 21.9 | 9.18 | 17.44 |
| Carbon monoxide | CO | 28.01 | 0.312[a] | 453.0 | 23.0 | 16.6 | 21.49 |
| Carbon dioxide | CO₂ | 44.01 | 0.459 | 361.0 | 14.58 | 13.9 | 13.9[a] |
| Methane | CH₄ | 16.4 | 0.414 | 592.0 | 30.6 | 10.26 | 18.98 |
| Ethylene | C₂H₄ | 28.05 | 0.495 | 452.0 | 17.7 | 9.07 | 13.37 |
| Ethane | C₂H₆ | 30.07 | 0.53 | 437.0 | 16.8 | 8.48 | 12.14 |

[a] Reprinted with permission from *Handbook of Chemistry and Physics*, 58th ed., R. C. Weast, Ed. Copyright 1977, Chemical Rubber Co., CRC Press, West Palm Beach, FL.
[b] Reprinted with permission from *Kinetic Theory of Gases*, E. H. Kennard, p. 149. Copyright 1938, McGraw-Hill, New York.
[c] Calculated from Equation (2.2).
[d] At atmospheric pressure.
[e] Calculated from Equation (2.30).
[f] $T = 210$ K, Reprinted with permission from *Cryogenic and Industrial Gases*, May/June 1975, p. 62. Copyright 1975, Thomas Publishing Co., Cleveland, OH.
[g] Footnote e, $T = 240$ K.
[h] $T = 18°C$.
[i] $T = 100°C$.
[j] $T = 8°C$.
[k] Calculated from viscosity data.

FIG. 17

ATOMIC LAYER DEPOSITION APPARATUS AND PROCESS

CROSS REFERENCE TO RELATED APPLICATIONS

This application claims benefit of priority from U.S. Provisional Patent Application No. 61/517,554, filed Apr. 21, 2011, which is incorporated herein by reference in its entirety.

BACKGROUND OF THE INVENTION

Field of the Invention

This invention relates generally to deposition systems and methods, and in particular to systems and methods for use in connection with atomic layer deposition processes, such as growing a thin film onto a substrate through plasma-enhanced atomic layer deposition (PEALD).

Description of the Related Art

As is known in the art of deposition technologies, atomic layer deposition (ALD) is a chemical vapor deposition (CVD) technique that enables surface-controlled film growth on the atomic scale with excellent uniformity. Surface-controlled film growth is a unique feature that is based on sequential, self-limiting chemical reactions between gas-phase precursor molecules and active surface species. During a typical ALD process, at least two gas-phase precursors are pulsed sequentially into a reaction space where a substrate is located. A complete sequence (or cycle) is made up of a series of pulse and purge steps. Pulse steps are separated by purge steps to remove any remaining precursor and/or volatile reaction byproducts from reaction space between pulses. Thus, a complete cycle requires a minimum of four steps.

During each pulse step, chemical reactions between precursor molecules and active surface species yield new surface species that passivate the surface. Once the surface becomes fully passivated, reactions are complete and result in the formation of a limited number of new surface species. Uniformity depends primarily on the distribution of active surface species/sites and completion of surface reactions during each precursor pulse step. Subsequently, remaining precursor and/or reaction byproducts are purged in preparation for next pulse step. A complete cycle is required to obtain the desired material. Each cycle deposits a very specific amount of material onto the substrate surface and is repeated until the desired amount of material has been deposited, enabling very accurate control of film thickness. Typical growth per cycle (GPC) is approximately 1 Å/cycle, but depends on the specific process.

Known thermal-based methods depend on substrate heating where the range of process temperatures resulting in ideal growth is referred to as the ALD window. Ideal growth is characterized by chemical adsorption of surface species that is irreversible, self-limiting, and complete. Outside of this temperature window, growth becomes non-ideal. At temperatures below the ALD window, thermal energy at the substrate surface becomes insufficient for surface reactions and/or to prevent physical adsorption (or condensation) of precursor molecules. Thermal self-decomposition of precursor molecules and/or desorption of chemically-adsorbed surface species result in non-ideal growth at higher substrate temperatures. In many cases, the ALD window is broad enough to enable ALD of different materials (e.g., multilayer film growth) at a constant substrate temperature.

PEALD methods utilize reactive plasma species as precursors for ALD surface reactions. Typical plasma gases include $O_2$, $N_2$ and $H_2$. Plasma technology is well established in other areas of thin film processing, such as physical vapor deposition (PVD), conventional CVD, and reactive ion etch (RIE) methods, and has been applied to ALD techniques as well. Benefits of PEALD include lower temperature process capability, as well as new pathways for chemical reactions that would otherwise be inaccessible by purely thermal methods. Plasma treatments can also be used for substrate surface modification prior to ALD processing.

Advantages of ALD methods include uniform, conformal surface coverage with atomic scale thickness and composition control. Sequential precursor pulsing eliminates the potential for gas-phase reactions that result in film defects so that highly reactive precursors can be utilized. Highly reactive precursors yield dense, continuous films with low levels of residual contamination and defects at relatively low process temperatures. High quality materials demonstrated include oxides, nitrides, metals, as well as complex multi-component films and multi-layered structures. Since ALD is primarily determined by precursors, substrate temperature, and starting surface, process is highly reproducible and scalable, thereby simplifying scale-up from research and development to production. These advantages are directly related to the unique surface-controlled growth mechanism of ALD.

One known limitation of existing ALD processing is the relatively low throughput due to long process times when compared to PVD and conventional CVD methods. However, this limitation has become less significant in recent years due to reduced scaling of microelectronic device dimensions and interest in other areas of nanotechnology, where advantages of the surface-controlled growth mechanism of ALD are paramount. Another disadvantage is the limited number of precursors presently available and, therefore, materials deposited by ALD methods. Precursor and process development are very active areas of research and development (R&D) activity.

Film uniformity, as described above, depends primarily on distribution of active surface sites and completion of surface reactions during each precursor pulse step. Sources of ALD non-uniformity have been reviewed in an article by K.-E. Elers et al., *Chem. Vap. Deposition* 12, 13 (2006), which is incorporated herein by reference. These sources of non-uniformity include overlapping of precursor pulses, non-uniform precursor delivery, and precursor thermal self-decomposition. In addition, reaction byproducts have been shown to contribute to film non-uniformity. The most prominent of these, however, is overlapping of precursor pulses. Adequate purging between precursor pulse steps is critical, since overlapping of pulses results in parasitic CVD surface reactions that decrease film uniformity and increase the potential for gas phase reactions and associated film defects. Moreover, rapid purging is necessary to reduce overall process times since cycle times are largely determined by the duration of purge steps.

Deposition is generally accomplished by placing the substrate to be coated into a vacuum chamber where it is heated to process temperature. Chamber volume is in communication with ports for vacuum and various inputs for introducing precursors and inactive gases. ALD apparatus designs are classified as perpendicular or parallel flow-type, based on net direction of gas flow relative to the substrate surface. Perpendicular flow designs are characterized by net gas flow that is perpendicular, and parallel (or cross-flow) designs by gas flow that is parallel, to the substrate surface.

Precursor pulse valves should be located in close proximity to the chamber to enable efficient purging. In addition, chamber volume should be minimized and inputs, chamber, and foreline virtually free of pockets (or dead-space volume). Adequate pumping, as well as heating of all input, chamber, and foreline components is essential for efficient purging between precursor pulse steps.

Typically, inactive gas flow is continuous and used to help efficiently remove remaining precursor and/or reaction byproducts between pulse steps. During pulse steps, inactive gas flow serves as a carrier gas to help transport precursors to the substrate surface. Efficient precursor delivery is beneficial to complete surface reactions quickly and without significant waste.

Limiting exposure of chamber surfaces between point of precursor injection and the substrate surface minimizes pulse times and precursor consumption. Furthermore, ALD surface chemistry is not always ideal, such that film uniformity depends on distribution of precursor across the substrate surface during pulse steps. For example, precursor thermal self-decomposition produces film thickness gradients determined by the precursor distribution across the substrate surface. Plasma processes may also require a reasonably uniform distribution of reactive plasma species across the substrate surface to achieve good film uniformity. Perpendicular flow-type designs are well suited to address these sources of ALD film non-uniformity.

With reference to the PEALD process, plasmas are generated by coupling an applied electromagnetic field to the process gas. Energy is transmitted to the process gas through acceleration of electrons by the applied field. Subsequent gas decomposition yields electrons, ions, and radicals (i.e., plasma). Inductive, radio frequency (RF) plasma sources are quite common (e.g., 13.56 MHz frequency) and routinely utilized to generate plasma for thin film processes.

Inductively coupled plasma (ICP) sources generate high-density plasma and are considered remote when the substrate is not directly exposed to the plasma generation region. The remote plasma configuration minimizes potential for substrate surface damage due to direct plasma exposure. Source electrode (or antenna) is typically mounted ex-situ, such that RF radiation is transmitted through a dielectric window (e.g., quartz or alumina) with relatively low sputter yield. Therefore, only the surface of the dielectric window is exposed directly to plasma, thereby eliminating the potential for ALD film contamination due to sputtering of the metallic electrode material. In addition, by operating in an inductive mode, the potential for film contamination due to sputtering of the dielectric window surface is minimized.

Plasma source integration, in general, increases process chamber design complexity and volume. Remote ICP sources are generally detachable and connected directly to the main vacuum chamber where the substrate is located. Hence, source is easily removable for servicing and/or when purely-thermal ALD configuration is desired. To obtain a uniform plasma distribution, the plasma port should be positioned above, and vacuum port below, the substrate surface. Ideally, the plasma and vacuum ports share a common central axis that is perpendicular to, and passes through the center of, the substrate surface. During precursor pulsing, it is important to avoid condensation of precursors (e.g., water) on the internal surface of the plasma source dielectric window that can become a source of parasitic CVD during subsequent precursor pulse steps. It is also very important to prevent deposition of absorbing layers on this surface, since this will result in attenuation of the RF signal and subsequent plasma source failure. Isolation of the plasma generation region from precursors (other than plasma process gases) may be achieved by incorporating an isolation valve; however, the cycling of an isolation valve during ALD can produce particles resulting in unwanted film defects.

Other apparatus design features include real-time process monitoring and cluster tool integration capabilities. Like plasma, the integration of these features increases chamber design complexity and volume. Spectroscopic ellipsometry (SE) is a powerful and effective method for real-time process control and monitoring. SE is a non-destructive thin film characterization technique that utilizes specularly-reflected polarized light to determine properties such as film thickness and optical constants. Integration typically requires at least two view-ports for mounting spectrometer components and transmission of light into, and out of, the ALD process chamber. Problems associated with the integration of chamber ports necessary for SE include coating of the transparent windows resulting in attenuation of transmitted light, as well as more complex chamber geometry and additional volume that increases required purge times.

Cluster tool integration enables multi-technique capabilities without having to break system vacuum and exposing potentially sensitive substrate surfaces to atmosphere prior to subsequent processing. These multi-technique capabilities include other thin film process modules, as well as in-situ analytical techniques (e.g., x-ray and Auger photoelectron spectroscopy, four-point probe, etc.) and single/cassette wafer loading modules. To enable vacuum transfer an additional chamber port is necessary. Similar to ports for SE integration, this additional port for substrate transfer increases chamber design complexity and volume and, therefore, required purge times.

It is noted that certain existing ALD systems (primarily for R&D activities) have more limited capability and do not include extra ports or the associated volume necessary for the enhanced design features described above. In some cases, these relatively simple systems enable thermal processes only and have no diagnostic or vacuum transfer capability. Therefore, internal volume is relatively small and all surfaces within the main process chamber (or apparatus) are equally exposed to the ALD precursors. As ports are added to accommodate enhanced process capabilities, inactive curtain gas may be employed to help keep precursors out of port volumes and to remove any precursors and/or reaction byproduct that may enter these ports during pulse steps. The combination of remote plasma, as well as chamber ports necessary for SE and vacuum transfer capability (primarily for more advanced R&D activities) requires specialized processing requirements and design consideration, as discussed above. For example, the process chamber volume increases significantly for at least two reasons. First, for plasma to be "remote" there must necessarily be sufficient spatial separation between the plasma generation region and substrate surface. In addition, spatial confinement of the plasma results in quenching of active species necessary for ALD surface reactions. Thus, remote plasma source integration requires a significant increase in internal volume to satisfy plasma related performance requirements.

Still further, extra chamber ports with associated volume are necessary to enable SE as well as vacuum transfer capability. The angle of incidence for SE is generally around 70° from the axis perpendicular to the substrate surface such that spatial requirements for SE and remote plasma integration are somewhat complimentary (i.e., volume required for one is advantageous for the other) making the combination desirable for advanced R&D applications (e.g., applications that take advantage of dual thermal and remote plasma process capability including in-situ, real-time SE and cluster tool integration). These enhanced system features, however, significantly increase process chamber design complexity to maintain ALD process performance.

In certain environments, curtain gas will be used to help protect plasma, analytical, and transfer port volumes. In addition, mechanical shutters and/or valves are usually necessary for one or more of these ports to help eliminate flow and/or diffusion of precursors into port volumes. For example, gate valves can be used to isolate the analytical view ports during precursor pulse steps. If these gate valves are not closed during precursor pulse steps, then the transparent windows for SE light transmission can become coated, resulting in limited ability to monitor process due to signal attenuation. Similar signal attenuation issues can occur when the remote plasma source is not properly protected during precursor pulse steps. This is due to deposition of absorbing materials on the transparent dielectric window resulting in plasma source failure. In either case, system venting and maintenance are required to rectify these issues.

According to certain existing systems, the cycling of mechanical valves during processing can generate particles that result in unwanted film defects. In particular, remote plasma source isolation can be most problematic since a gate valve is typically positioned directly above the substrate surface where particles tend to rain down onto the surface when the valve is cycled. In cases where an inactive gas barrier is used to prevent film deposition inside the plasma source (without the use of a mechanical gate valve), it is still difficult to prevent diffusion of certain precursors into the plasma port during precursor pulse steps. For example, water is the most common oxidant used for thermal ALD process. During precursor pulse steps, water diffusion and subsequent condensation inside the remote plasma port can become a source of parasitic CVD that severely limits thermal ALD process performance.

In summary, there are many challenges associated with the integration of various ALD apparatus design features. For example, such features include remote plasma, SE for real-time process monitoring, and cluster tool integration capabilities for advanced, single wafer R&D applications. Due to more complex process chamber geometry, as well as additional volume requirements, these enhanced system features significantly increase apparatus design complexity to maintain ALD process performance (e.g., uniformity and cycle times). Additional challenges associated with remote plasma integration include plasma performance issues associated with exposure of internal plasma source components to ALD precursors (other than plasma process gases). Similar challenges are associated with the integration of analytical ports necessary for SE, where exposure of internal components to ALD precursors can result in issues with feature performance. Accordingly, there is a need in the art for an atomic layer deposition apparatus and process that recognizes and addresses some or all of these challenges and issues.

SUMMARY OF THE INVENTION

Generally, provided is an atomic layer deposition apparatus and process that overcomes or addresses some or all of the above-discussed deficiencies and drawbacks associated with existing atomic layer deposition systems. Preferably, provided is an atomic layer deposition apparatus and process that provides improved deposition characteristics for the fabrication of wafers in both research and development and production applications. Preferably, provided is an atomic layer deposition apparatus and process that facilitates the effective growth of a thin film onto a substrate. Preferably, provided is an atomic layer deposition apparatus and method that provides plasma-enhanced atomic layer deposition. Preferably, provided is an atomic layer deposition apparatus and process that leads to beneficial focusing of precursor gases towards a substrate. Preferably, provided is an atomic layer deposition apparatus and process that creates a curtain gas area that prevents or minimizes contact between injected gas and an inner surface of a wall or port of a chamber.

Accordingly, and in one preferred and non-limiting embodiment, provided is an atomic layer deposition apparatus. The apparatus includes: a chamber having outer and inner surfaces, wherein at least a portion of the inner surfaces define an internal volume of the chamber; a fixture assembly positioned in the internal volume of the chamber and configured to hold a substrate within the internal volume of the chamber; a plurality of gas injection ports configured to facilitate the introduction of gas into the apparatus; at least one precursor gas arrangement in fluid communication with at least one of the plurality of gas injection ports and configured to introduce precursor gas into the internal volume of the chamber; and at least one inactive gas dispersion arrangement in fluid communication with at least one of the plurality of gas injection ports and configured to introduce inactive gas into the internal volume of the chamber. The inactive gas dispersion arrangement includes a primary dispersion member having a thickness and a plurality of holes extending therethrough, such that at least a portion of the inactive gas introduced to the internal volume of the chamber through the plurality of holes substantially concentrically focuses the precursor gas towards a surface of the substrate.

In another preferred and non-limiting embodiment, provided is an atomic layer deposition apparatus. The apparatus includes: a chamber having outer and inner surfaces, wherein at least a portion of the inner surfaces define an internal volume of the chamber; a fixture assembly positioned in the internal volume of the chamber and configured to hold a substrate within the internal volume of the chamber; a plurality of gas injection ports configured to facilitate the introduction of gas into the apparatus; at least one precursor gas arrangement in fluid communication with at least one of the plurality of gas injection ports and configured to introduce precursor gas into the internal volume of the chamber; and at least one inactive gas dispersion arrangement in fluid communication with at least one of the plurality of gas injection ports and configured to introduce inactive gas into the internal volume of the chamber. The inactive gas dispersion arrangement includes a primary dispersion member having a thickness and a plurality of holes extending therethrough, such that at least a portion of the inactive gas introduced to the internal volume of the chamber through the plurality of holes substantially concentrically focuses the precursor gas towards a surface of the substrate. The apparatus further includes at least one additional port configured to facilitate the introduction of inactive gas into the inner area of the chamber, wherein the inactive gas contacts and mixes with the inactive gas introduced through the inactive gas dispersion arrangement.

In a further preferred and non-limiting embodiment, provided is an atomic layer deposition process, including: removably positioning a substrate within an internal volume of a chamber; introducing precursor gas into the internal volume of the chamber through at least one gas injection port; and introducing inactive gas into the internal volume of the chamber through at least one inactive gas dispersion arrangement comprising a primary dispersion member having a thickness and a plurality of holes extending therethrough, such that at least a portion of the inactive gas introduced to the internal volume of the chamber through the plurality of holes substantially concentrically focuses the precursor gas towards a surface of the substrate.

In another preferred and non-limiting embodiment, provided is a modeling system for an atomic layer deposition apparatus having a primary dispersion member. The system includes at least one computer having a computer readable medium with program instruction stored thereon, which, when executed by a processor of the computer, cause the processor to: generate a plurality of variables relating to the primary dispersion member, wherein at least a portion of the plurality of variables are at least partially calculated from at least one of the plurality of variables; modify at least one of the plurality of variables based at least partially on input data received from a user; recalculate, using the at least one processor, at least a portion of the plurality of variables based at least partially on the at least one modified variable; and generate another plurality of variables relating to the primary dispersion member.

In yet another preferred and non-limiting embodiment, provided is a modeling system for an atomic layer deposition apparatus having a primary dispersion member, the primary dispersion member defining a primary reaction space, a charge volume, and at least one hole. The system includes at least one computer having a computer readable medium with program instruction stored thereon, which, when executed by a processor of the computer, cause the processor to: receive input data representative of at least one of the following: gas type, temperature, thickness of the primary dispersion member, measurement of the at least one hole, number of holes, or any combination thereof; determine, based at least partially on the input data and a baseline pressure within the primary reaction space, a mean free path for a gas type; and determine, based at least partially on the mean free path and a viscosity for the gas type, a pressure for the charge volume.

These and other features and characteristics of the present invention, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

BRIEF DESCRIPTION OF THE DRAWINGS

FIGS. 1(a)-(e) are side sectional and schematic views of one embodiment of a portion of an atomic vapor deposition apparatus according to the principles of the present invention, including gas flow during various vapor deposition processing steps;

FIG. 2 is a cross sectional view of one embodiment of an atomic vapor deposition apparatus according to the principles of the present invention;

FIG. 16 is screenshot of one embodiment of an interface for a modeling system for an atomic vapor deposition apparatus according to the principles of the present invention; and FIG. 17 is a chart illustrating gas properties taken from J. F. O'Hanlon, "A User's Guide to Vacuum Technology Third Edition", (John Wiley & Sons, Inc., New Jersey, 2003).

DETAILED DESCRIPTION OF THE PREFERRED EMBODIMENTS

Figure 1A:
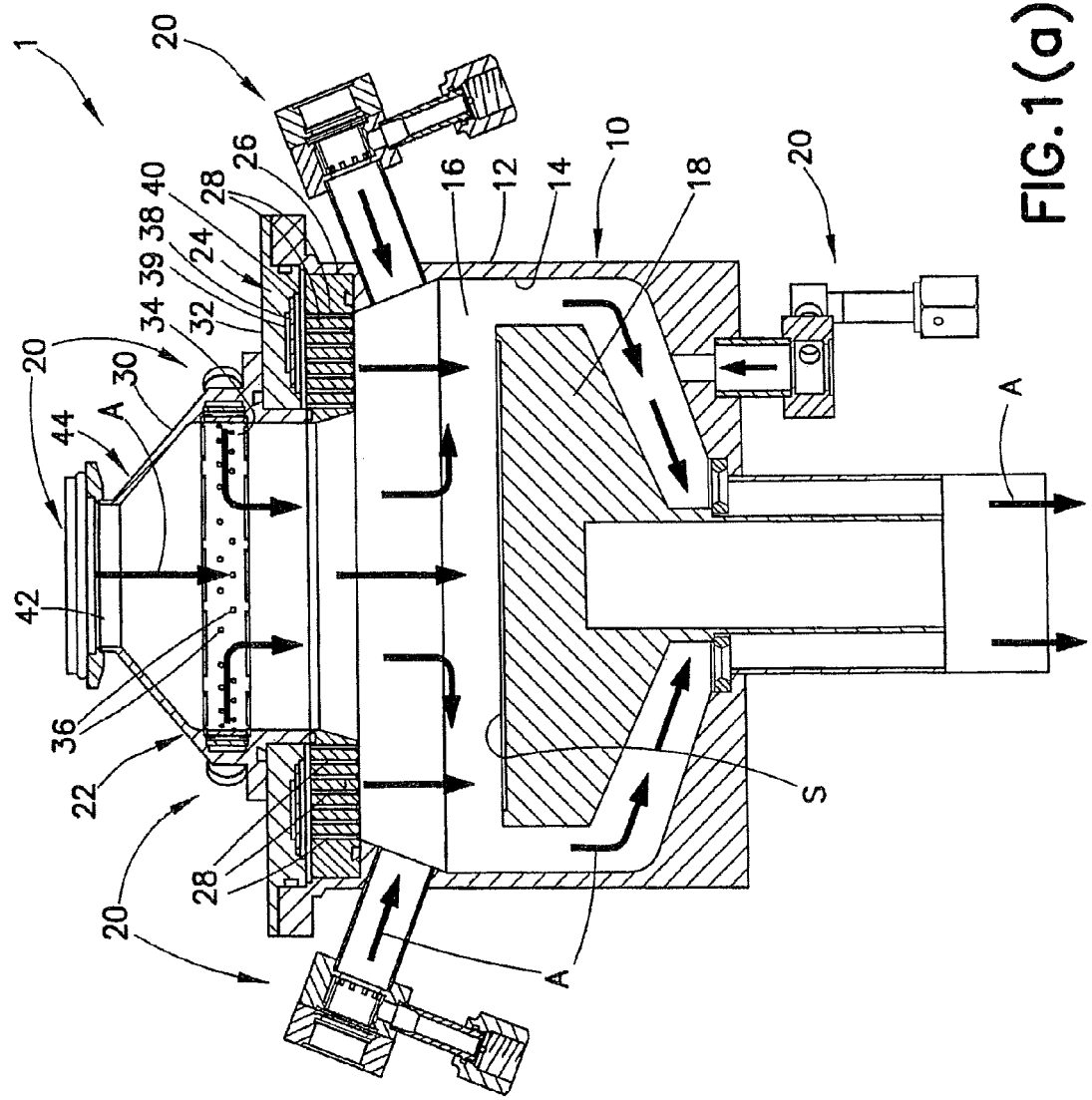

For purposes of the description hereinafter, the terms "end", "upper", "lower", "right", "left", "vertical", "horizontal", "top", "bottom", "lateral", "longitudinal" and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

The present invention is directed to an atomic layer deposition apparatus 1 and system, as illustrated in one preferred and non-limiting embodiment in FIGS. 1(a)-1(e). In particular, and in this embodiment, the atomic layer deposition apparatus 1 includes a chamber 10 having outer surfaces 12 and inner surfaces 14. At least a portion of the inner surfaces 14 define an internal volume 16 of the chamber 10. A fixture assembly 18 is positioned in the internal volume 16 of the chamber 10 and is configured to hold or support a substrate S within the internal volume 16 of the chamber 10. Multiple gas injection ports 20 are configured to facilitate the introduction of gas and/or vapor into the apparatus 1. For the remainder of the discussion and for clarity, the term "gas and/or vapor" will be referred to as "gas". As discussed hereinafter, the gas injection ports 20 may have the exclusive function of injecting gas into the apparatus 1, or may have multiple features associated therewith. For example, while some of the gas injection ports 20 may still serve to facilitate the introduction of gas into the apparatus 1, certain of the ports 20 may be used for viewing the internal volume 16 of the chamber 10, accessing the internal volume 16 of the chamber 10, or otherwise directly or indirectly interacting with the internal volume 16 of the chamber 10.

As illustrated in FIG. 1(a), the apparatus 1 includes at least one precursor gas arrangement 22 that is in fluid communication with one or more of the gas injection ports 20. This precursor gas arrangement 22 is further configured to introduce precursor gas into the internal volume 16 of the chamber 10. Still further, this preferred and non-limiting embodiment of the atomic layer deposition apparatus 1 includes at least one inactive gas dispersion arrangement 24 that is in fluid communication with one or more of the gas injection ports 20. This inactive gas dispersion arrangement 24 is configured to introduce inactive gas into the internal volume 16 of the chamber 10. In one aspect, the at least one precursor gas arrangement 22 may be supported on an upper surface of the at least one inactive gas dispersion arrangement 24.

With continued reference to FIG. 1(a), the inactive gas dispersion arrangement 24 includes a primary dispersion member 26 having a thickness and multiple holes 28 extending therethrough. In this manner, at least a portion of the inactive gas introduced into the internal volume 16 of the chamber 10 occurs through one or more of the holes 28. This introduction of inactive gas through the primary dispersion member 26 effectively concentrically focuses the precursor gas towards a surface of the substrate S. In one preferred and non-limiting embodiment, at least a portion of the inactive gas dispersion arrangement 24 may be positioned above the fixture assembly 18. In another preferred and non-limiting embodiment, at least one of the holes 28 may be positioned above the fixture assembly 18.

Figure 1B:
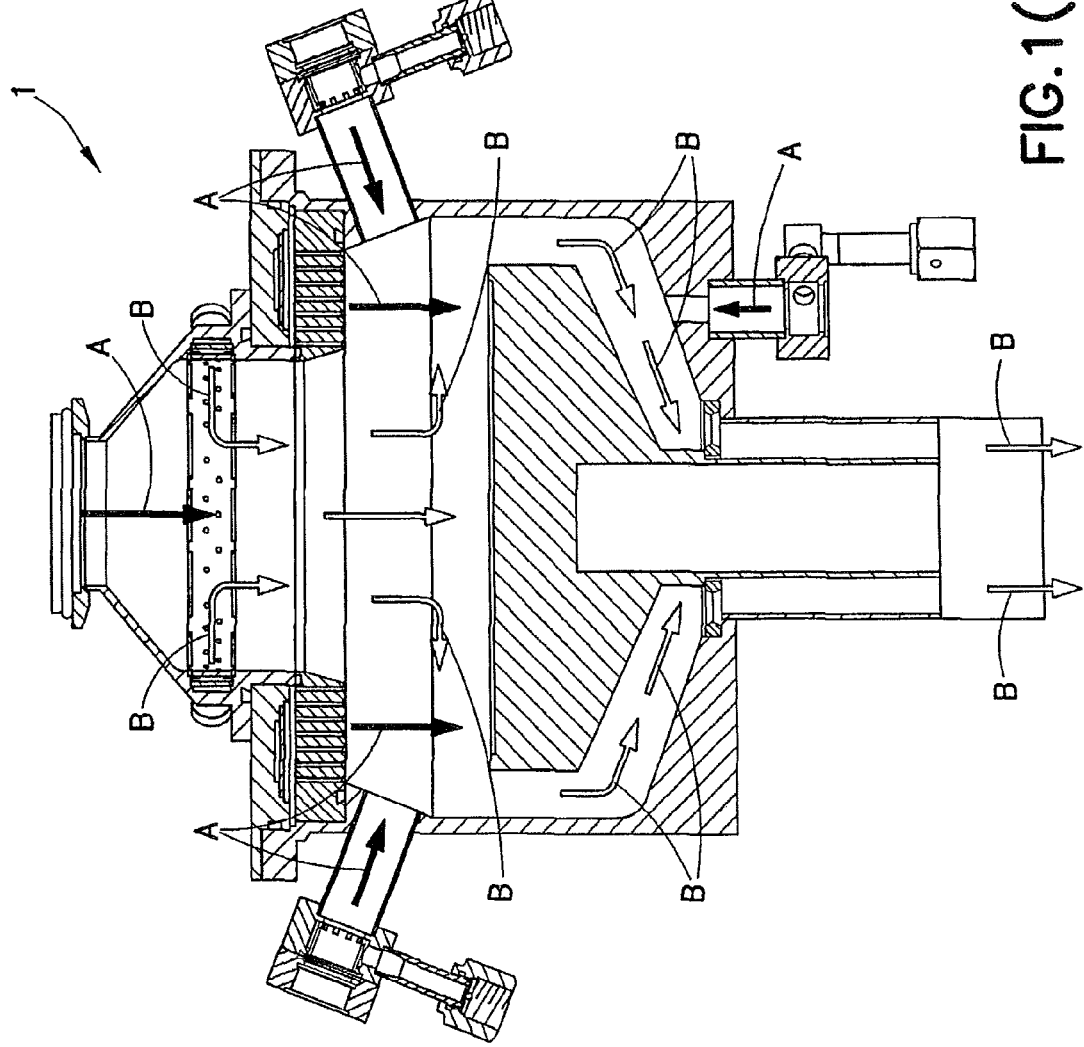

In another preferred and non-limiting embodiment of an atomic layer deposition process implemented in connection with or facilitated by the apparatus 1 of the present invention, multiple precursor pulse steps (separated by purge steps) are used in implementing the atomic layer deposition process. First, and with reference to FIG. 1(a), the flow of inactive gas in the apparatus 1 is preferably continuous, viscous, and laminar. In addition, and in order to provide this beneficial precursor focusing functionality, the inactive gas flow occurs through all gas injection ports 20 on a continuous basis. This inactive gas flow is represented by arrow A in FIGS. 1(a)-1(e). In a first precursor pulse step, precursor gas is introduced through certain of the gas injection ports 20, resulting in a mixture of precursor gas and inactive gas, as represented by arrow B. This step is illustrated in FIG. 1(b). As seen in FIG. 1(c), the continuous injection of the inactive gas, together with the pulsing of the precursor gas in the described manner, creates a virtual barrier (C) that serves to minimize or prevent contact of the precursor gas with the inner surfaces 14 of the chamber 10, as well as to focus the precursor gases towards the substrate S. Accordingly, the presently-designed atomic layer deposition apparatus 1 provides both this barrier as well as the focusing functionality to provide an improved atomic layer deposition process.

In this embodiment, this barrier and focusing functionality occurs at least partially through the use of the primary dispersion member 26. In addition, a primary precursor gas injection port 42 is centrally located near the top of the apparatus 1 and positioned above the fixture assembly 18, i.e., the surface of the substrate S. In the manner described, the primary precursor gas injection port is surrounded by a distribution of inactive gas or curtain gas from the primary dispersion member 26. Of course, as shown in FIG. 1(b), the precursor gas may also be injected into the chamber 10 via other gas injection ports 20, such as the concentrically-located gas injection ports 20 positioned below and around the primary precursor gas injection port 42. Again, this curtain gas distribution creates the virtual barrier that limits precursor gas diffusion toward the inner surfaces 14 of the chamber 10, and focuses the precursor gases towards the fixture assembly 18 and, thus, surface of the substrate S. Such a design improves process performance by facilitating efficient precursor gas utilization and subsequent purging between precursor pulse steps (as discussed hereinafter). In addition, the atomic layer deposition apparatus 1 of the present invention is particularly useful when additional ports are necessary to enable enhanced system features, where multiple gas injection ports 20 are primarily used for other functionality, e.g., vacuum transfer, in-situ ellipsometry integration, and the like.

Figure 1D:
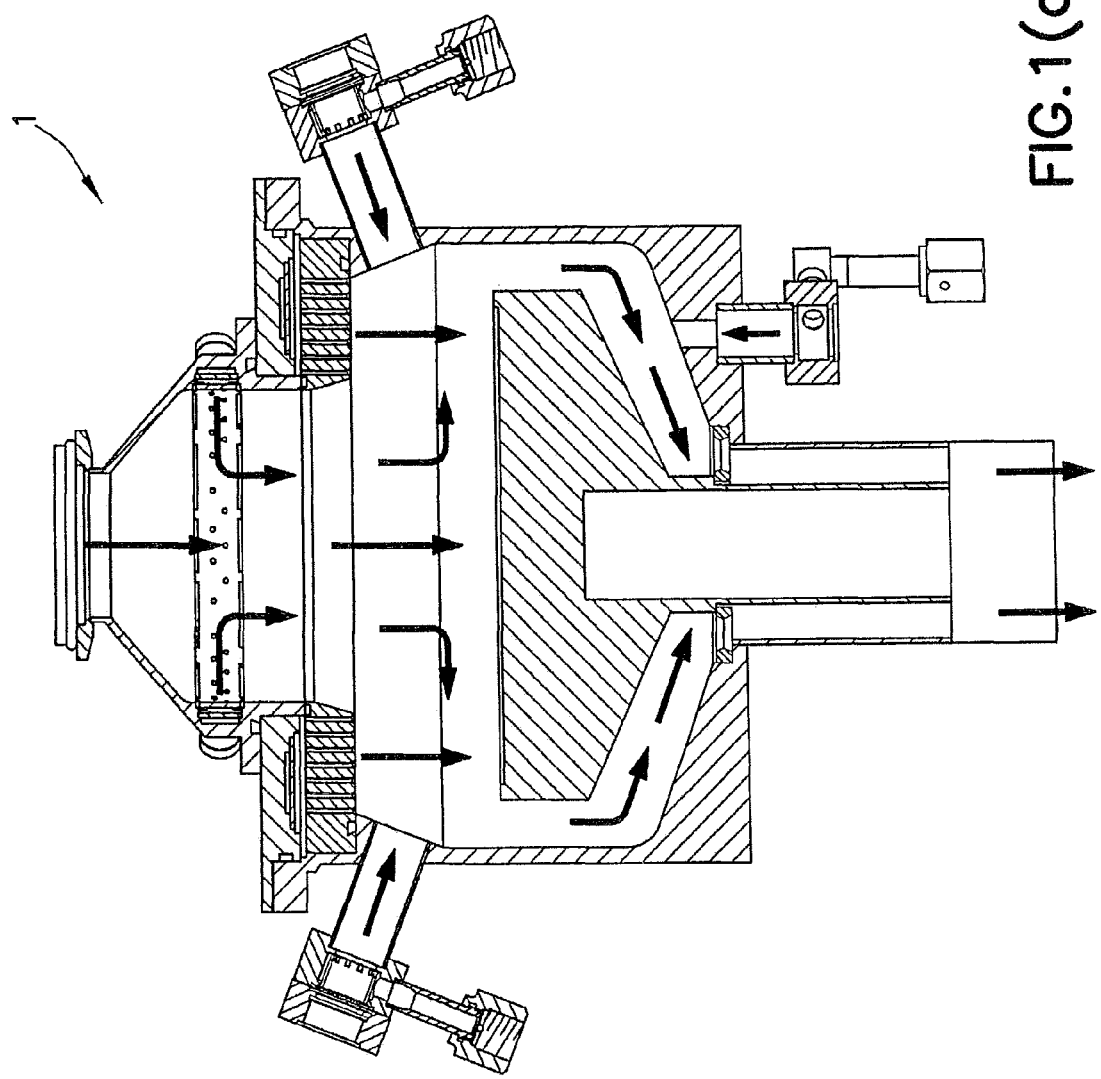

As illustrated in FIG. 1(d), after the first pulsing step, the chamber 10 is purged through the preferably continuous injection of inactive gas through all available gas injection ports 20. In the second precursor pulse step, precursor gas is injected through the primary precursor gas injection port 42, as represented by arrow D in FIG. 1(e). However, and again, through the selective and continuous injection through the remaining gas injection ports 20, the above-discussed barrier and focusing functionality is enabled. After this second precursor pulsing step, the chamber 10 is again purged through the injection of inactive gas through all of the gas injection ports 20, as illustrated in FIG. 1(a), thereby completing one preferred and non-limiting embodiment of the ALD cycle.

It is further noted that the atomic layer deposition apparatus 1 illustrated in FIGS. 1(a)-1(e) provides the appropriate injection of inactive gas, such that precursor gases cannot enter or diffuse from reaction space into the area above the primary dispersion member 26. Such diffusion would result in increased purge times and premature clogging of the holes 28 of the primary dispersion member 26.

In one preferred and non-limiting embodiment, the thickness of the primary dispersion member is constant (as illustrated), but may also be variable to change the flow characteristics of the inactive gas and/or the precursor gas. Accordingly, in another preferred and non-limiting embodiment, an effective thickness ($L_{eff}$) of the primary dispersion member 26 is greater than the diffusion length ($L_D$) of the precursor gas. In one preferred and non-limiting embodiment, the diffusion length ($L_D$) in one dimension is defined as: $L_D^2 = (4 \ D_{12} t_R) = (4\alpha D'_{12} \ N/Q) L$, where $D_{12}$=interdiffusion coefficient of two gases at pressure <P>, <P>=$(P_1+P_2)/2$=average pressure inside of hole 28 volume, $D'_{12}=D_{12}$<P>, $t_R$=residence time, N=total number of holes 28, $\alpha$=cross-sectional area of the hole 28, Q=throughput=N $Q_H$, $Q_H$=throughput per hole 28, and L=nominal primary dispersion member 26 thickness. In another preferred and non-limiting embodiment, and when the hole 28 is circular, the diffusion length ($L_D$) in one dimension is defined as: $L_D^2 = (4 \ D_{12} \ t_R) = (\pi D'_{12} \ N \ d^2/Q) L$, where $D_{12}$=interdiffusion coefficient of two gases at pressure <P>, $D'_{12}=D_{12}$<P>, $t_R$=residence time, N=total number of holes, d=hole diameter, Q=throughput, and L=nominal primary dispersion member 26 thickness. Still further, the effective thickness ($L_{eff}$) of the primary dispersion member 26 is defined as: $L_{eff} = (1-\Delta P_2/\Delta P) L$, where $\Delta P = (P_1 - P_2)$=pressure difference across primary dispersion member, $P_2$=baseline pressure within a primary reaction space, $P_1$=pressure within a charge volume, and $\Delta P_2$=pressure increase within the primary reaction space during the introduction of the precursor gas. As stated, the average pressure inside of hole 28 volume is defined as <P>=$(P_1+P_2)/2$. Accordingly, the thickness of the primary dispersion member 26, as well as the hole 28 diameter, spacing, and distribution, may be optimized to achieve the desired functionality within a wide range of atomic layer deposition processing flow environments and pressure regimes.

In another preferred and non-limiting embodiment, the primary dispersion member 26 is a substantially disk-shaped member, and a number of holes 28 per unit area of the primary dispersion member 26 is substantially constant. Still further, a cross-sectional area of at least a portion of the holes 28 may be a substantially round shape, a substantially oval shape, a substantially square or rectangular shape, a substantially triangular shape, a substantially hourglass shape, or the like. Depending upon the desired flow characteristics, at least a portion of the holes 28 extending through the primary dispersion member 26 may be positioned in a substantially hexagonal pattern. In another embodiment, at least a portion of the holes 28 extending through the primary dispersion member 26 is positioned in a substantially concentric ring pattern. Still further, and in another preferred and non-limiting embodiment, the holes 28 extending through the primary dispersion member 26 are spaced and distributed to provide laminar flow of at least a portion of the inactive gas within at least a portion of the internal volume 16 of the chamber 10.

As discussed above, one or more of the gas injection ports 20 may have the injection of gas as the primary functionality, or may have the injection of gas as the secondary function. For example, one or more of the gas injection ports 20 may have, as the primary functionality, the ability to transfer the substrate S into and out of the chamber 10, or to provide an analytical port to facilitate interaction with the internal volume 16 of the chamber 10. Further, one or more of the ports 20 may continuously introduce inactive gas into the internal volume 16 of the chamber 10, and in certain pulsing steps (as discussed above) inject a mixture of the inactive gas and the precursor gas that is introduced through the inactive gas dispersion arrangement 24. Still further, and as illustrated above in FIG. 1(e), one or more of the gas injection ports 20 may serve to inject only precursor gas during one or more of the pulsing steps. Still further, and in another preferred and non-limiting embodiment, one or more of the gas injection ports 20 are configured to introduce inactive gas into the internal volume 16 of the chamber 10 at an angle with respect to a central longitudinal axis extending through the apparatus 1.

In a further embodiment of the ALD apparatus 1 of the present invention, the inactive gas dispersion arrangement 24 is also configured to introduce inactive gas into the internal volume 16 of the chamber 10 in such a manner that an inactive gas barrier is formed, which minimizes or eliminates contact between the precursor gas and the inner surfaces 14 of the chamber 10, the surfaces of one or more of the gas injection ports 20, other ports or access areas (e.g., analytical, measurement, and/or access ports), and the like. In addition, and in this embodiment, the precursor gas arrangement 22 includes a gas dispersion member 34 having multiple holes 36 extending therethrough. This preferred arrangement is illustrated in FIG. 1(a). In another preferred and non-limiting embodiment, the inactive gas dispersion arrangement 24 includes an initial gas dispersion member 38 that is configured to at least partially distribute the flow of inactive gas to the primary gas dispersion member 26. In particular, this initial gas dispersion member 38 has multiple holes extending therethrough and separates a volume 39 from a volume 40. This allows the inactive gas to be more evenly distributed for impact on and interaction with the primary dispersion member 26. This arrangement is further illustrated in the preferred and non-limiting embodiment of FIGS. 3 and 6, which demonstrate the use of a secondary dispersion member 120 (initial gas dispersion member 38), as well as the volumes 203 (volume 39) and 204 (volume 40) located, respectively, above and below the secondary dispersion member 120.

With continued reference to the preferred and non-limiting embodiment of FIG. 1(a), the primary precursor gas injection port 42 is in the form of a plasma port 42 (as one of the gas injection ports 20), and this plasma port 42 is configured to introduce plasma species into the internal volume 16 of the chamber 10. In another embodiment, the apparatus 1 includes a control arrangement (not shown) for at least partially controlling the flow of the precursor gas, the inactive gas, and/or the plasma species. For example, and as discussed hereinafter and in further preferred and non-limiting embodiments, the control arrangement may include a throttle valve, or be configured to at least partially control an effective pumping speed of a pump. For example, this control arrangement may be used to control the effective pumping speed of the pump to control a residence time in at least a portion of the internal volume 16 of the chamber 10. As discussed hereinafter, it is particularly useful to control the parameters in a primary reaction space that is substantially located in an upper portion of the internal volume 16 of the chamber 10, as opposed to a secondary reaction space that is substantially located in a lower portion of the internal volume 16 of the chamber 10. Various other control arrangements and parameter impacts are discussed hereinafter.

As discussed above, multiple gas injection ports 20 extend through the outer surface 12 of the chamber 10, including a lid assembly 44, and these gas injection ports 20 introduce gases into the internal volume 16, including the primary and secondary reaction spaces. This lid assembly 44 can be made from multiple, detachable components for flexibility, as well as to simplify manufacturing and serviceability. As further discussed above, the apparatus 1 may include a plasma port 42 located on the lid assembly 44 for use in integrating a remote ICP source. In addition, the apparatus 1 can enable dual thermal and plasma-enhanced process capabilities. However, when a plasma port 42 is not be used, the lid assembly or other portions of the apparatus 1 can be optimized to include performance for purely thermal ALD processes.

As illustrated in FIGS. 1(a)-1(e), and in one preferred and non-limiting embodiment, the apparatus 1 geometry has a generally cylindrical symmetry, where the central axis is oriented vertically and perpendicular to the planar, circular surface of the substrate fixture assembly 18. The central axis of the apparatus 1 (or chamber 10) passes through the origin of the fixture assembly 18 surface, and the fixture assembly 18 may include an embedded heating element for active heating of the substrates S. In this embodiment, the top surface of the fixture assembly 18 faces upward toward the lid assembly 44 or top of the apparatus 1.

In operation, and in this preferred and non-limiting embodiment, the lid assembly 44 is attached to the top of the chamber 10 and is made up of the reactant input adapter 30 and top-plate 32 subassemblies. A total of five gas injection ports 20 pass through the outer surface of the reactant input adapter 30, including the above-discussed plasma port 42 for remote ICP source integration. Gas is injected into the plasma port 42, specifically through a plasma tube (as discussed hereinafter). The remaining four gas injection ports 20 are located below the plasma port 42, where they form a circular pattern and share a common horizontal plane perpendicular to the central axis of the apparatus 1. These gas injection ports 20 are radially-directed inward toward the central axis and spaced 90° apart. A common annular volume within the outer wall of the reactant input adapter 30 is charged by the output of these four gas injection ports 20. The net flow is directed vertically downward and perpendicular to the planar surface of the fixture assembly 18, and, thus, the substrate S.

As discussed above, the continuous flow of inactive gas through certain of the gas injection ports serves a variety of purposes. When the precursor gas is periodically pulsed through these gas injection ports 20 during pulse steps, the inactive gas flow serves as a carrier gas to help transport the precursor to the substrate S surface. Also, and as discussed, a barrier (or curtain) is formed to prevent unwanted surface exposure. For example, when precursor gases are not being pulsed through the plasma port 42, inactive gas flow acts as a curtain gas to prevent precursor diffusion into the dielectric plasma tube that can result in subsequent ICP source failure. Further, during purge steps, inactive gas flow through each of gas injection ports 20 is used to efficiently remove remaining precursor and/or reaction byproducts. To improve pulse and purge efficiency, the inner surface of the reactant input adaptor 30 is shaped to maintain the laminar flow pattern that prevents trapping and/or recirculation of gases. In addition, and as discussed, efficiency is further improved by centrally mounting the reactant input adapter to the top-plate 32 subassembly.

Another preferred and non-limiting embodiment of an atomic layer deposition (ALD) apparatus 101 according to the invention is illustrated in FIGS. 2-9. In this embodiment, and with reference to FIG. 2, the ALD apparatus 101 of this embodiment includes a lid assembly 102, a chamber 103, and a substrate fixture assembly 104. The lid assembly 102 and chamber 103 have outer surfaces and inner surfaces, where, as discussed above, the inner surfaces define an internal volume containing substrate fixture assembly 104. The substrate fixture assembly 104 includes a planar surface 105 for supporting a substrate S, such that a plane 106 defined by surface 105 separates the internal volume into upper and lower sections. As discussed above, the substrate S is sequentially exposed to each precursor gas within the upper section, thereby defining a primary reaction space 107. The lower section defines a secondary reaction space 108, including exhaust port 109 for removing the inactive and precursor gases.

In this preferred and non-limiting embodiment, multiple gas injection ports (e.g., ports 110, 114, 123, 125, and 307) extending through the outer surface of the lid assembly 102 and/or chamber 103, which are used to introduce gases into the primary reaction space 107 and/or the secondary reaction spaces 108. The lid assembly 102 is manufactured from multiple, detachable components for flexibility purposes, as well as to simplify manufacturing and serviceability. In this embodiment, a plasma port 110 is located on the lid assembly 102 and is used for remote ICP source 301 integration (see FIGS. 8 and 9). This particular embodiment enables dual-thermal and plasma-enhanced process capabilities. In another aspect of the embodiment, the plasma port 110 is excluded, and the lid assembly 102 is optimized to improve performance for purely thermal ALD processes.

In this preferred and non-limiting embodiment, the ALD apparatus 101 geometry has a cylindrical symmetry, where a central axis 111 is oriented vertically and perpendicular to a circular, planar surface 105 of the substrate fixture 104. The central axis 111 passes through the center of the surface 105. The substrate fixture 104 has an embedded heating element (not shown) for active heating of substrates S placed in thermal contact with the surface 105. The normal vector associated with the planar surface 105 points vertically upward toward the lid assembly 102.

Figure 6:
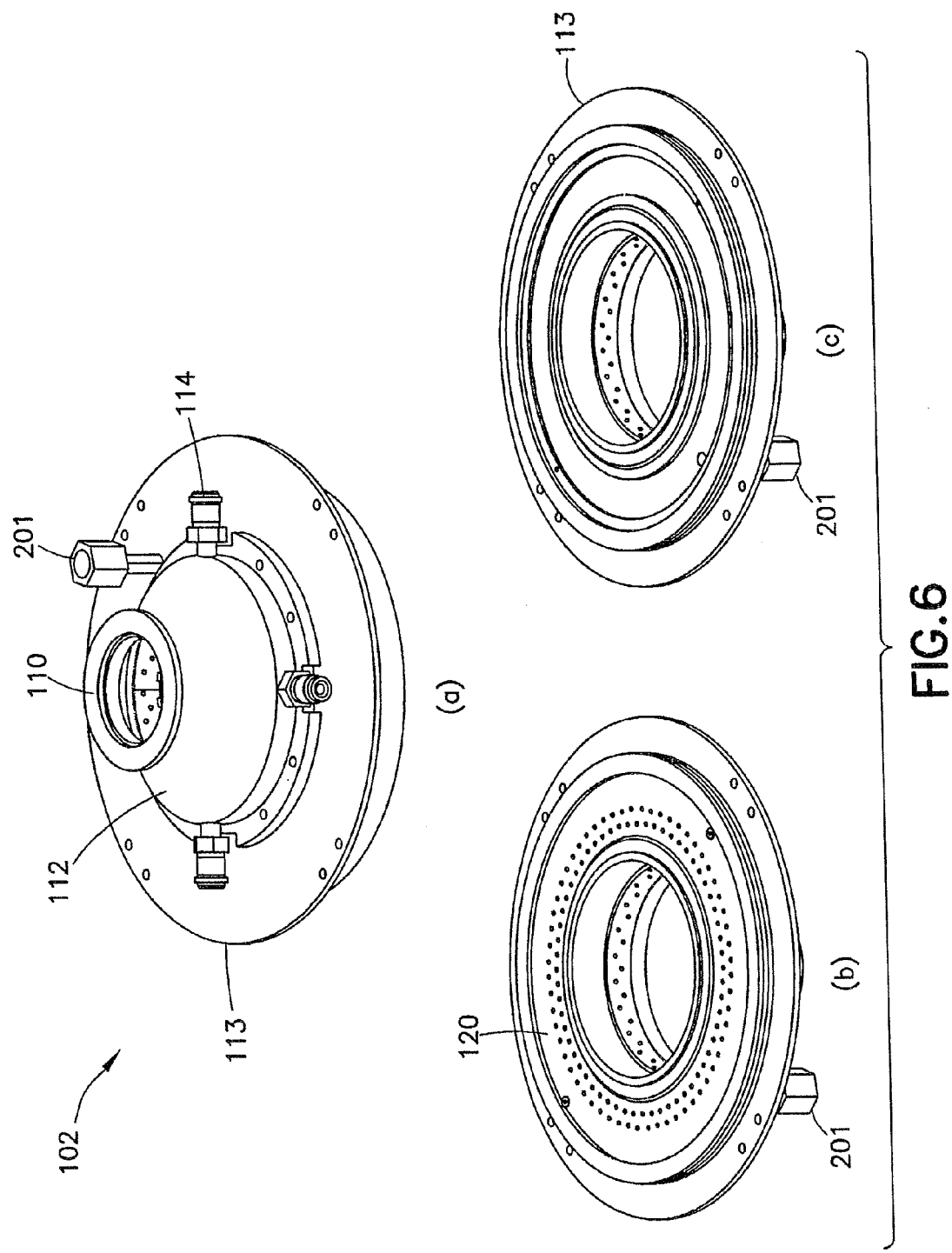
FIGS. 6(a)-(c) are perspective views of a portion of the atomic vapor deposition apparatus of FIG. 2.

Further, the lid assembly 102 is attached to the upper portion of chamber 103 and includes a precursor input adapter 112 and top-plate 113 subassemblies. With reference to FIGS. 2 and 6, five precursor input ports pass through the outer surface of the precursor input adapter 112, including four, spaced gas injection ports 114 and the plasma port 110 for use in integration with a remote ICP source 301. The remote ICP source 301 includes a cylindrical dielectric tube (not shown) where the axis of this tube is in-line with central axis 111 of ALD apparatus 101. An ex-situ electrode (not shown) forms a helix around the cylindrical plasma tube for plasma generation. Gas is injected into the plasma tube through input port 302 and flows out through plasma port 110, with reference to FIGS. 2, 8, and 9.

Figure 3:
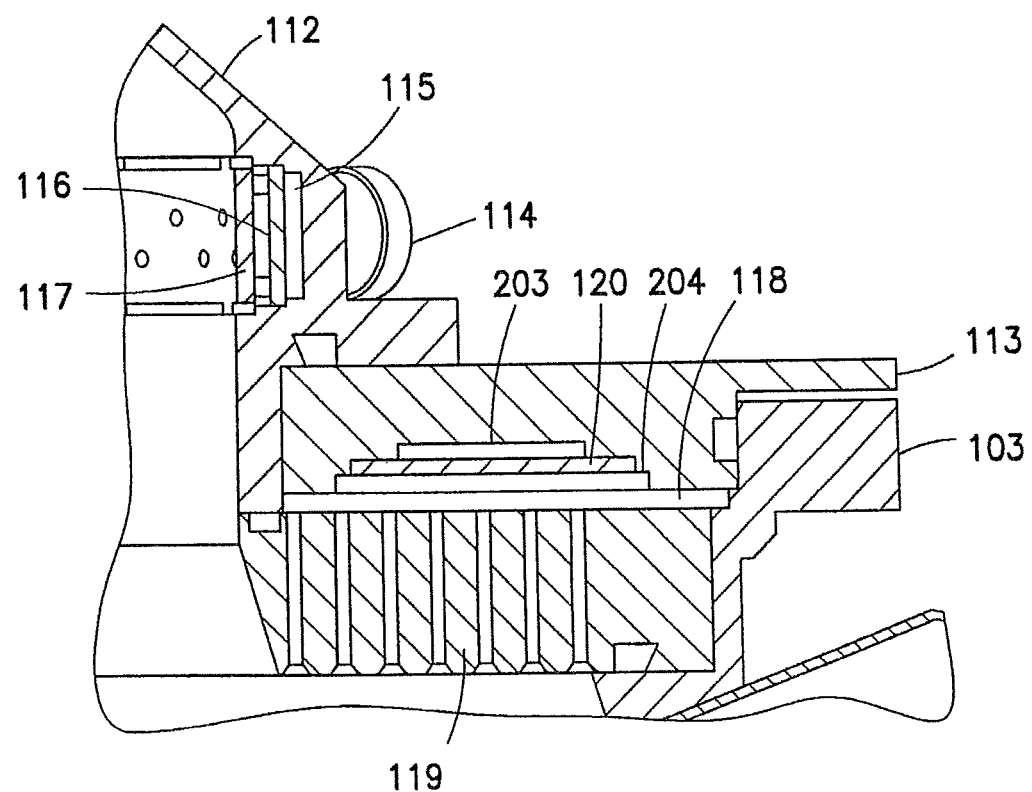
FIG. 3 is a cross sectional view of a portion of the atomic vapor deposition apparatus of FIG. 2.
Figure 4:
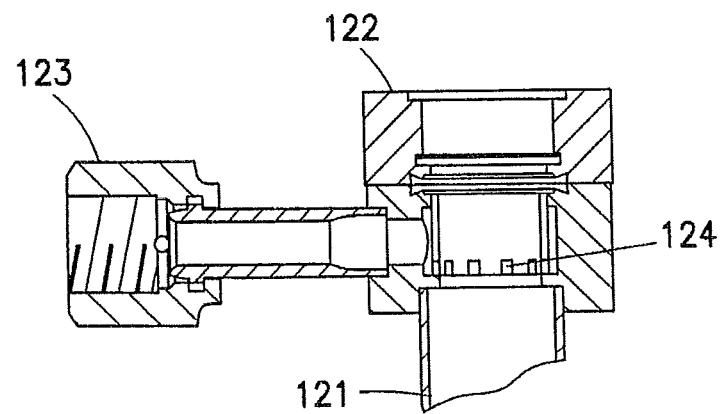
FIG. 4 is a cross sectional view of another portion of the atomic vapor deposition apparatus of FIG. 2.
Figure 5:
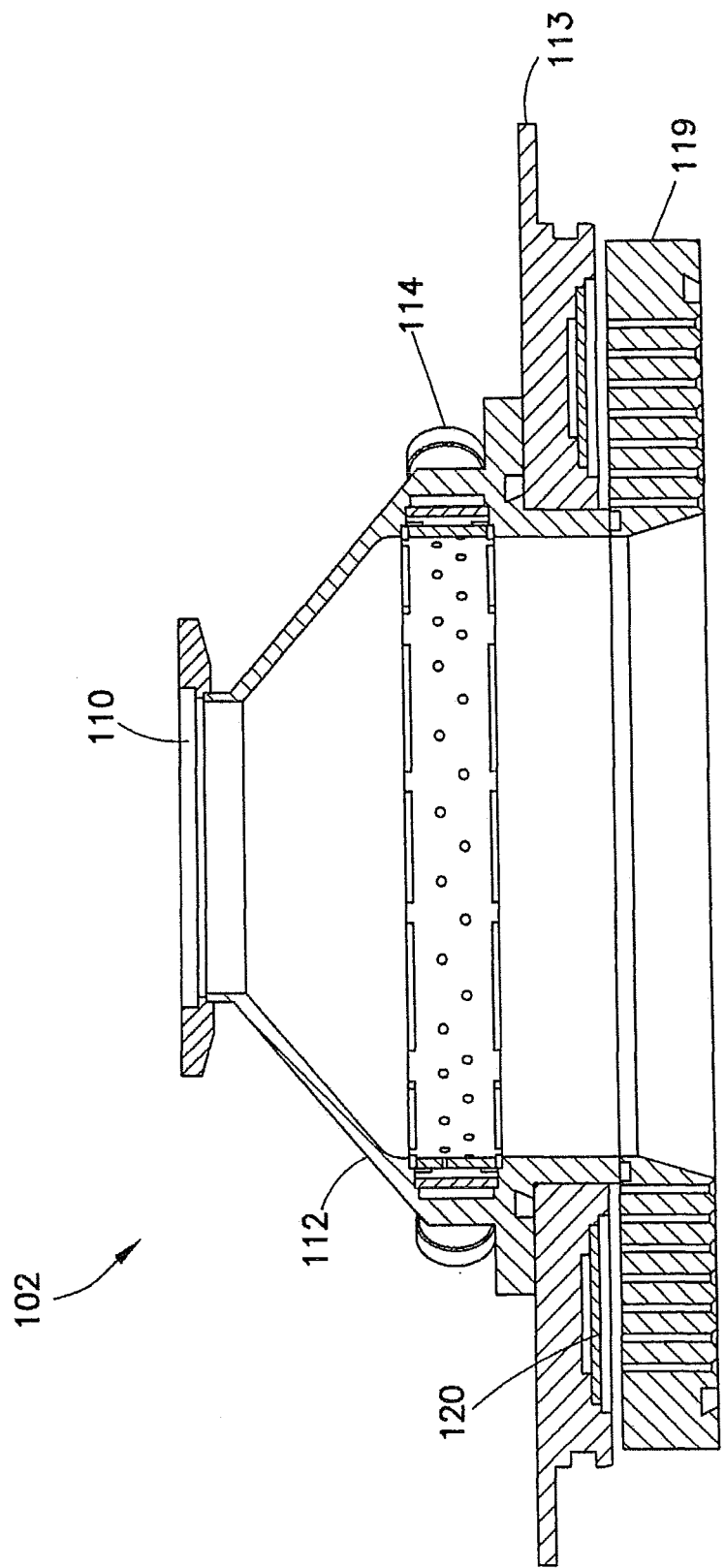
FIG. 5 is a cross sectional view of a further portion of the atomic vapor deposition apparatus of FIG. 2.

The four, spaced precursor gas injection ports 114 are located below the plasma port 110, form a circular pattern and share a common horizontal plane perpendicular to central axis 111 of ALD apparatus 101. These gas injection ports 114 are radially directed inward toward the central axis 111 and are spaced about 90° apart. A common annular volume 115, within outer wall of precursor input adapter 112, is charged by the output of gas injection ports 114. As shown in FIG. 3, this common charge volume (or cell) is divided by a baffle plate 116 that is used to disperse gas within the volume 115. A showerhead plate 117 is used to further distribute the radial outflow from the annular cell volume 115 toward the central axis 111. The radial gas flow through the showerhead plate 117 combines with the gas flowing downward from the plasma port 110. The net flow is directed vertically downward and perpendicular to the planar surface 105 of substrate fixture 104.

During at least a portion of the ALD process, inactive gas flows continuously through each of the five gas injection ports 110 and 114. Precursor gases are pulsed periodically through these ports 110, 114 during pulse steps, where the continuous inactive gas flow serves as a carrier gas to help transport precursor molecules to the substrate S surface. It also acts to form a barrier (or curtain) to prevent unwanted internal surface exposure. For example, when precursors are not being pulsed through the plasma port 110, inactive gas flow acts as a curtain gas to prevent precursor diffusion into the plasma tube, which could result in subsequent remote ICP source 301 failure. During purge steps, inactive gas flow through each of the five gas injection ports 110 and 114 is used to efficiently remove remaining precursor and/or reaction byproducts. To improve pulse and purge efficiency, the inner surface of precursor input adapter 112 is shaped to maintain laminar flow, thereby preventing trapping and/or recirculation of gases. In addition, efficiency is improved by centrally mounting the precursor input adapter 112 to the top-plate 113.

With reference to FIGS. 3, 5, 6, and 7, the top-plate 113 subassembly includes an annular disk shape that surrounds the centrally-mounted precursor input adapter 112. A curtain gas port 201, extending though the outer surface of the top-plate 113, is used to introduce inactive gas to an inactive gas dispersion arrangement, which, in this preferred and non-limiting embodiment, includes an annular charge volume 118 partly defined by the horizontal surface of an annular, primary dispersion member 119 (which may be in the form of a showerhead-type disk). Sufficient uniformity within this charge volume (or cell) is maintained by flowing gas through an annular, secondary dispersion member 120 (with volumes 203 and 204, respectively, above and below the secondary dispersion member 120). These volumes 203, 204 and the secondary dispersion member 120 separate the curtain gas port 201 and the upper primary dispersion member 119 surface. Vertical holes 202 through the primary dispersion member 119 enable communication between the charge volume 118 and the primary reaction space 107. Inactive gas flow from the top-plate 113 surrounds the net gas flow from the precursor input adapter 112 and is directed vertically downward along the inner surfaces of chamber 103, thereby forming a virtual curtain gas barrier to minimize reactant diffusion toward the inner surfaces within the primary reaction space 107.

As seen in FIGS. 2, 4, 8, and 9, the chamber 103 surfaces include three ports in communication with the primary reaction space 107, including two analytical ports 121 that enable ellipsometer 303 integration for real-time, in-situ process monitoring. A transfer port 304 is provided for substrate S transfer. The analytical ports 121 are at a fixed angle of about 70° with respect to the central axis 111 of the ALD apparatus 101 and share a common vertical plane. The focal point of each analytical port 121 is located just above the center point of the planar surface 105. Further, each analytical port 121 includes a transparent view-port 122 for transmitting light, as well as curtain gas port 123 and associated dispersion mechanism 124 for establishing inactive curtain gas flow through port volume. The curtain (inactive) gas is used to prevent precursor diffusion and subsequent coating of the view-ports 122.

Figure 8:
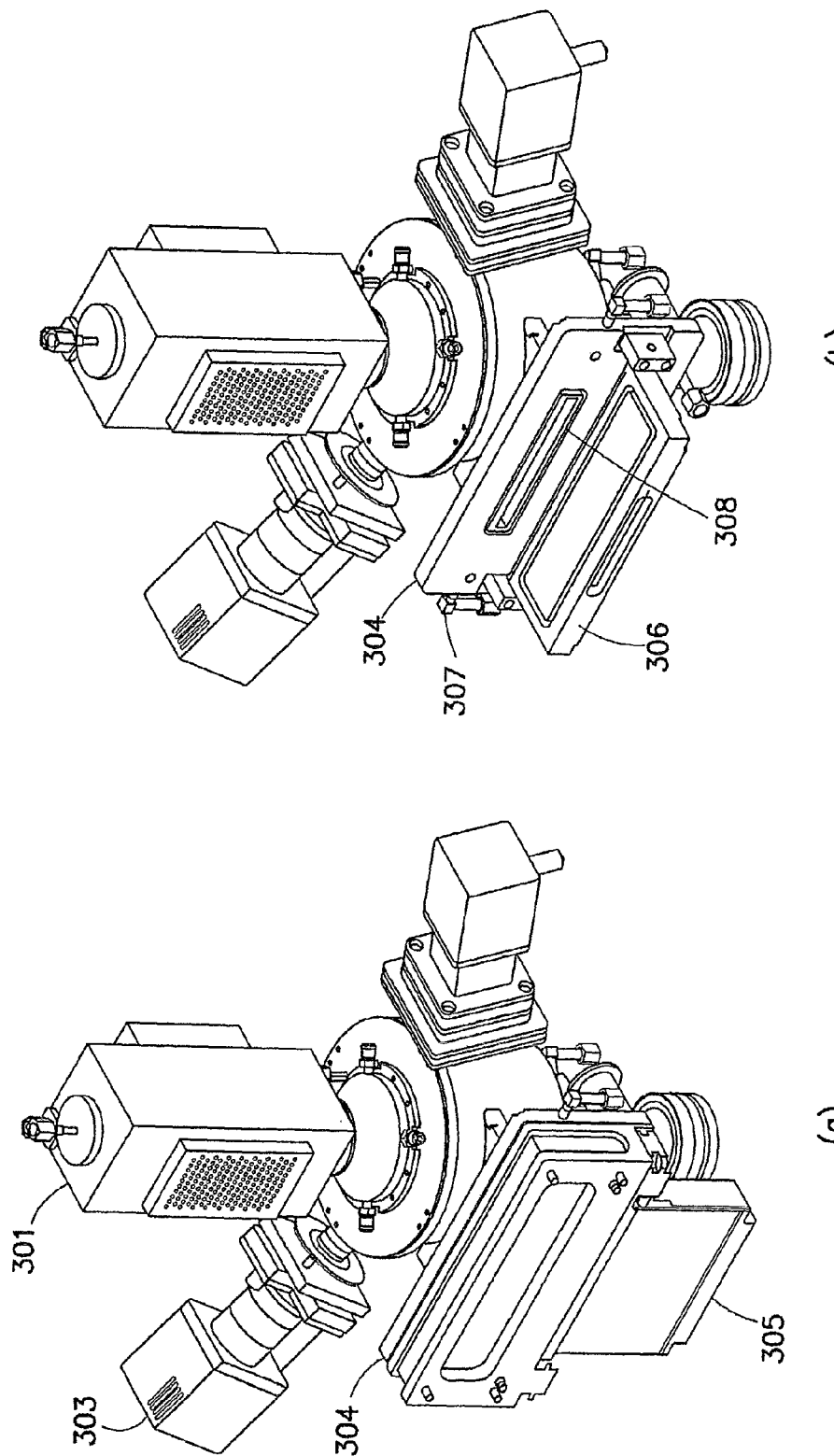
FIGS. 8(a)-(b) are perspective views of one embodiment of an atomic vapor deposition apparatus according to the principles of the present invention.
Figure 9:
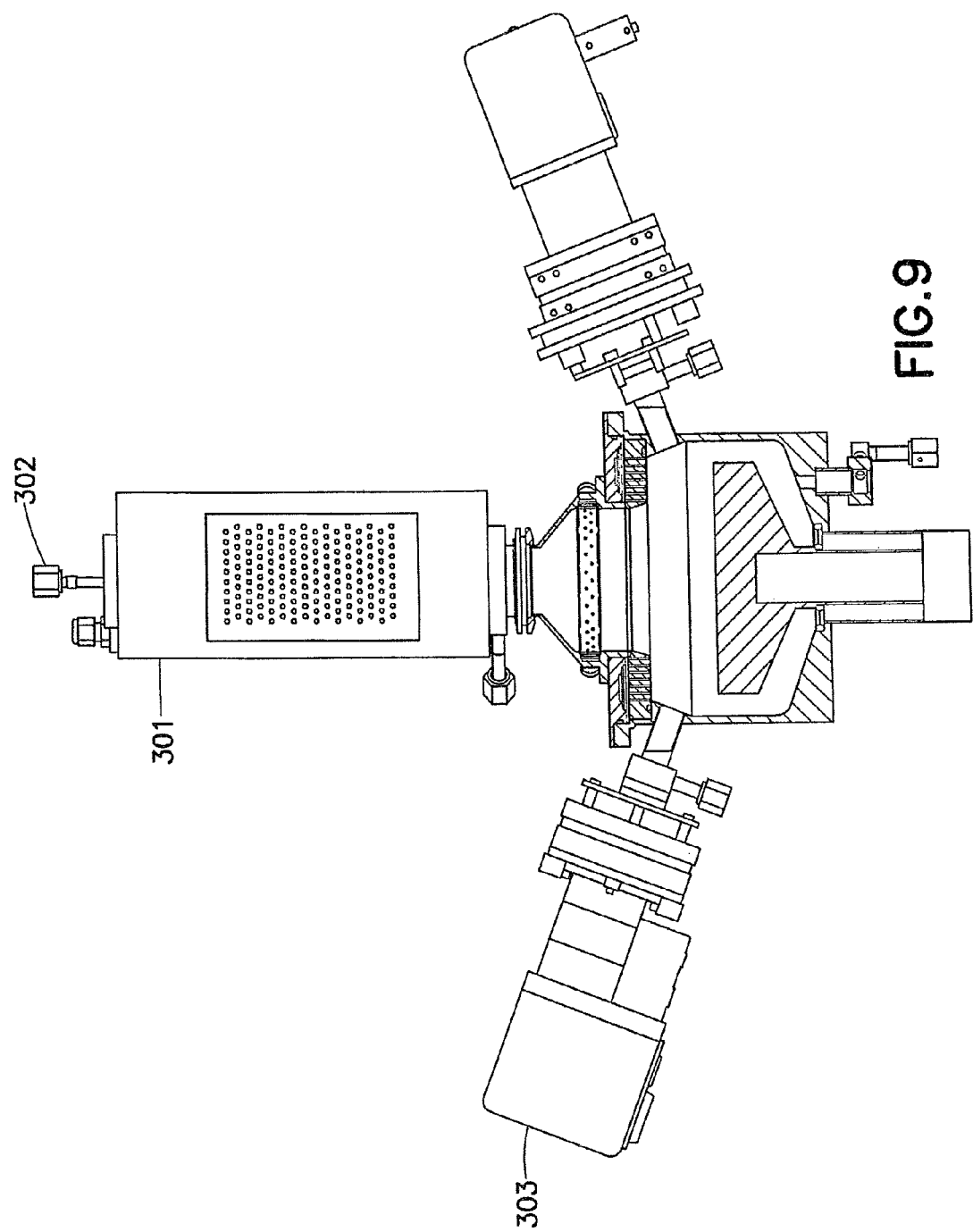
FIG. 9 is a side view of a portion of the atomic vapor deposition apparatus of FIG. 8.

With specific reference to FIGS. 8 and 9, the transfer port 304 enables substrate S transfer for a variety of system configurations including cluster tool arrangements enabling multi-technique capabilities. Other embodiments include direct transfer from atmosphere, as well as transfer at atmospheric pressure in an inactive gas environment that utilizes a glove-box type enclosure. Transfer into the apparatus 101 involves inserting the substrate S through the transfer port 304 and into the primary reaction space 107 using a mechanical transfer arm (not shown). When the transfer position has been reached, a vertical pin-lift mechanism (not shown) through a pin-lift port 125 is used to lift the substrate from the transfer arm. Once elevated, the transfer arm is retracted and the substrate S is lowered onto the surface 105 of the substrate fixture 104. The chamber 103 is then isolated using a gate-valve 305 or door assembly 306. The process is reversed for transfer out of the apparatus 101. The transfer port 304 has two curtain gas ports 307 and a dispersion mechanism 308 for establishing inactive curtain gas flow through the port volume to minimize precursor diffusion.

The inactive curtain gas flowing through the analytical ports 121 and transfer port 304 is combined with the inactive curtain gas flowing downward from the primary dispersion member 119, such that the resulting superposition of flow creates an inactive gas barrier that focuses output from the centrally-located precursor input adapter 112 onto substrate S surface. During the precursor pulse steps, this superposition of inactive curtain gas flow minimizes precursor diffusion toward the inner surfaces of the chamber 103 within the primary reaction space 107, thereby focusing the concentration of precursor onto the substrate S surface.

In this preferred and non-limiting embodiment, the inactive gas dispersion arrangement includes the above-mentioned primary dispersion member 119 for facilitating the enhanced precursor focusing functionality. In addition, the design, as discussed hereinafter, substantially prevents precursor diffusion from the primary reaction space 107 into the charge volume 118 within the top-plate 113, which would result in increased purge times and premature clogging of holes 202.

As discussed above, and with reference to FIG. 7, the diffusion length ($L_D$) in one dimension for N identical holes 202 is preferably defined as follows: $L_D^2 = (4 D_{12} t_R) = (\pi D'_{12} N d^2/Q)L$, where $D_{12}$=interdiffusion coefficient of two gases, $t_R$=residence time, d=hole diameter (based upon the use of substantially circular holes 202), Q=throughput=(N $Q_H$), and L=nominal primary dispersion member 119 thickness. Since holes 202, in this particular case, are of equal diameter and length, Q=(N $Q_H$), where $Q_H$ is the flow per hole. Still further, residence time $t_R = (V/S_{eff}) = (V<P>/Q_H)$, where $S_{eff}$=effective pumping speed and V=hole 202 volume=($\pi d^2 L/4$). In this preferred and non-limiting embodiment, $D'_{12} = (D_{12}<P>)$, where $D_{12}$=interdiffusion coefficient of two gases and $<P>$=average pressure=$(P_1+P_2)/2$. In one preferred and non-limiting embodiment, the diffusion coefficient $D_{12}$ and corresponding gas properties were taken from J. F. O'Hanlon, "A User's Guide to Vacuum Technology Third Edition", (John Wiley & Sons, Inc., New Jersey, 2003), which is incorporated herein by reference. The corresponding gas properties are identified in the chart depicted in FIG. 17. Since $D_{12}$ is inversely proportional to pressure $<P>$, the relationship established above for diffusion length ($L_D$) is independent of pressure.

During the ALD process, steady-state inactive gas flow establishes the process pressure baseline. Sequential precursor pulsing increases pressure within the primary reaction space 107 and the secondary reaction space 108. These transient pressure increases can result in backflow of precursor molecules from the primary reaction space 107 into the charge volume 118 of the top-plate 113, resulting in significantly reduced process performance. To address this issue, the pressure increase within holes 202 through primary dispersion member 119, during steady-state inactive gas flow, is assumed to be linear. Based on this linear approximation, and in this preferred and non-limiting embodiment, the effective thickness of primary dispersion member 119 is defined as follows: $L_{eff} = (1 - \Delta P_2/\Delta P)L$, where $\Delta P = (P_1 - P_2)$=pressure difference across member (where $P_2$ equals baseline pressure within the primary reaction space 107, and $P_1$ equals pressure within the charge volume 118), and $\Delta P_2$ equals pressure increase within the primary reaction space 107 during precursor pulsing. Therefore, the transient pressure within the primary reaction space 107 during precursor pulsing is $P_2'=(P_2+\Delta P_2)$. Given the measured value of $P_2$, pressure $P_1$ is calculated to determine the pressure difference across the primary dispersion member 119 according to the relationship $Q=(C \Delta P)$, where Q is the throughput and C is the conductance of the disk. In general, the conductance C is pressure dependent and based on the specific configuration of the primary dispersion member 119. For parallel conductance paths, total conductance C is simply the summation of individual components $C_i$ as follows: $C=(\Sigma C_i)$, where sum is over the total number (N) of individual flow paths.

Figure 7:
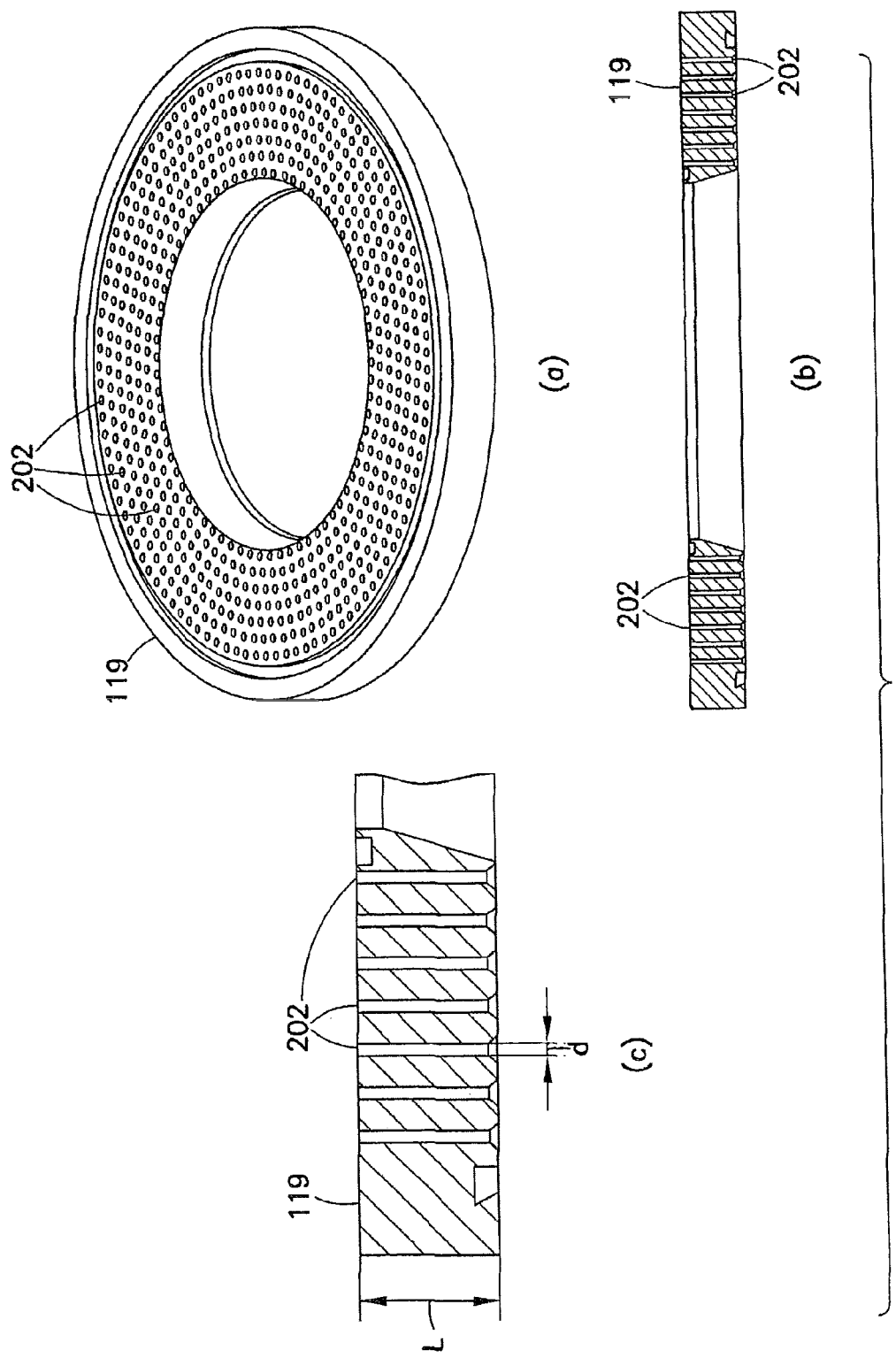
FIG. 7(a) is a perspective view of an inactive gas dispersion arrangement of the atomic vapor deposition apparatus of FIG. 2.
FIG. 7(b) is a cross sectional view of the inactive gas dispersion arrangement of FIG. 7(a)
FIG. 7(c) is a cross sectional view of a portion of the inactive gas dispersion arrangement of FIG. 7(a)

With continued reference to this preferred and non-limiting embodiment, and with reference to FIG. 7, the primary dispersion member 119 nominal thickness (L) is constant. The holes 202 are substantially circular with constant diameter (d), where the central axis of these small, identical holes/tubes is perpendicular to surface above and below the primary dispersion member 119. Since holes 202 are identical, $Q=(C \Delta P)=(N C_H \Delta P)$, where Q=throughput, N=total number of holes 202, and $C_H$=hole/tube conductance for a single hole 202. Thus, pressure $P_1$ above primary dispersion member 119 is calculated using the following equation: $Q=(N C_H \Delta P)$, where hole 202 conductance $C_H$ is determined using Knudsen's equation for conductance through a tube. Knudsen's equation can be found in A. Roth, "Vacuum Technology Third, Updated and Enlarged Edition", (North-Holland, The Netherlands, 1990), which is incorporated herein by reference.

In one preferred and non-limiting embodiment, one or more computerized models may be used to calculate pressure $P_1$, diffusion length $L_D$ and effective thickness $L_{eff}$, as well as to identify optimal tube length, cross-sectional area $\alpha$ and/or hole diameter d, and/or total number of holes N. The models may be in the form of functions, macros, software modules, and/or other forms of program code and/or algorithms executable by a data processing system, such as a computer. For example, and in one preferred and non-limiting embodiment, pressure $P_1$ within the charge volume 118 may be determined for various combinations of throughputs, downstream pressures, gas types, temperatures, diameters, and the like. It will be appreciated that these models may be used to determine preferred or optimal values for various components and/or parameters and to predict various attributes and/or conditions for or in the atomic layer deposition apparatus 101 according to the present invention. The models are configured to accept a variety of parameters as input, and to output (e.g., on a display screen, printer, or through other output devices) one or more values of desired design attributes and/or parameters. It will be appreciated that the models may be used for the purposes of simulation, design, and/or other forms of analysis. The models may display a plurality of values for variables relating to the primary dispersion member 119, and allow for users to modify at least one of the values. In response to the modification of one or more of the values, the models may then recalculate the remainder of the variables that are affected by the user modification. As an example, the models may receive data relating to gas type, temperature, thickness, and/or surface area of the primary dispersion member, hole diameter, number of holes, and the like. Based on these inputs, a pressure $P_1$ for the charge volume of the primary dispersion member 119 may be determined.

For example, in one preferred and non-limiting embodiment, pressure $P_1$ (i.e., pressure within charge volume 118 of primary dispersion member 119) may be calculated using a tube conductance model based on Knudsen's equation. To determine $P_1$, data inputs include gas type, temperature, pressure (baseline pressure within the primary reaction space $P_2$), number of holes, tube diameter, and primary dispersion member thickness. Data inputs may be entered by a user with an input device, may be already provided by the models, or may be retrieved from various data structures, measurement tools, or other data resources. Unless otherwise noted, all units are in centimeter-gram-seconds (i.e., CGS units). First, the viscosity ($\eta$) may be determined by the equation: $\eta=[0.998/(\pi\sigma^2)](m k T/\pi)^{1/2}$, where $\sigma$=molecular diameter, m=molecular mass, k=Boltzmann constant (k=1.3805E-16 erg/K), and T=temperature. As an example, consider argon ($\sigma$=3.64E-08 cm, m=6.6337E-23 g) at T=403 K (or 130° C.). In this case the viscosity is determined to be 2.60E-04 poise.

Having calculated the viscosity, a tube conductance model (e.g., function and/or determination) based on Knudsen's equation may be used to calculate upstream pressure $P_1$ within the charge volume 118. In this embodiment, the program or model utilizes the following throughput equation developed above: $Q=(N C_H \Delta P)$, where N=number of holes and $\Delta P=(P_1-P_2)$. Tube conductance $C_H$ is defined by Knudsen's equation: $C_H=a+b[(1+c)/(1+1.24c)]$. The variables a, b and c are defined as follows: $a=(\pi d^4 <P>)/(128\eta L)$, $b=[d^3/(6 L)](2\pi R T/M)^{1/2}$, and $c=(d<P>/\eta)(M/R T)^{1/2}$, where d=tube diameter, <P>=average pressure=$(P_1+P_2)/2$, $\eta$=viscosity, L=nominal primary showerhead member thickness, R=ideal gas constant [8.314E+07 erg/(K mole)], T=temperature, and M=molar mass. Again, consider argon ($\sigma$=3.64E-08 cm, M=39.948 g/mole) at T=403 K (or 130° C.). In addition, consider $P_2$=2000 Ba (or 1.500 Torr), Q=1.495E+07 Ba cm$^3$/s (11.22 Torr liters/sec or 600 sccm), d=0.127 cm, N=609, and L=1.60 cm. Using the equations above for throughput and tube conductance (i.e., Knudsen's equation), pressure $P_1$ may be solved for. With continued reference to the example inputs and values, $P_1$ would be equal to 2520 Ba (or 1.890 Torr).

A function, model, program, and the like for a showerhead disk 119 (i.e., primary dispersion member) design may also be provided to calculate the diffusion length $L_D$. For example, this model may include the one dimensional equation for $L_D$ previously established: $L_D^2=(\pi D'_{12} N d^2/Q)L$, where $D'_{12}$=pressure independent interdiffusion coefficient of two gases, N=number of holes, d=hole diameter, Q=throughput, and L=nominal primary dispersion member 119 thickness. The functional form of the coefficient $D'_{12}$ can be expressed as follows: $D'_{12}=\{3.771(k T/\pi)^{3/2}[(1/m_1)+(1/m_2)]^{1/2}\}/(\sigma_1+\sigma_2)^2$, where k=Boltzmann constant (k=1.3805E-16 erg/K), T=temperature, $m_1$=molecular mass of component 1, $m_2$=molecular mass of component 2, $\sigma_1$=molecular diameter of component 1, and $\sigma_2$=molecular diameter of component 2. With continued reference to the example inputs, $L_D$ can be solved for the following given values: T=403 K (or 130° C.), $m_1$=6.6337E-23 g (argon molecular mass), $m_2$=2.9916E-23 g (water molecular mass), $\sigma_1$=3.64E-08 cm (molecular diameter for Ar), and $d_2$=4.60E-08 m (molecular diameter for water). Given these values, diffusion length $L_D$ is determined to be 0.976 cm (or 0.384 inches). Finally, $L_{eff}$ may be calculated from the nominal thickness L of the primary dispersion member, the calculated value of $L_D$, and the pressure ratio $\Delta P_2/\Delta P$ based on the following equation: $L_{eff}=(1-\Delta P_2/\Delta P)L$. Given values for $\Delta P$ and $\Delta P_2$ as 519.9 Ba (or 0.390 Torr) and 133.3 Ba (or 0.100 Torr), respectively, $L_{eff}$ is determined to be 1.190 cm (or 0.468 inches). Therefore, $L_{eff}/L_D$ is equal to 1.219. It will be appreciated that the models may utilize any number of algorithms to calculate desired values based on user input, constants, and other parameters.

It should be appreciated that these models and determinations may be effected by or implemented on any suitable computing device. Further, an appropriate user interface may be provided to accept user inputs (whether directly or as chosen from a list and/or menu) and display or otherwise provide the results, as outputs, both in alphanumeric form and/or in graphical/design form. This input/output modeling system may be dynamic (as discussed above) and allow for an iterative design approach for modeling and/or manufacturing an atomic layer deposition apparatus according to the present invention. Further, it is envisioned that appropriate graphics, pictures, explanations, and/or descriptions may be visually provided in order to assist the user in understanding the input and/or output variables and parameters, thus allowing a more effective understanding of the design process. For example, the required initial inputs (e.g., chamber temperature, chamber downstream pressure, mass flow rate, number of holes, hole diameter (or cross section), primary dispersion member 26, 119 thickness, molar mass (of the inactive gas and the precursor gas), molecular diameter, and the like), the adjustable inputs (e.g., pressure above the primary dispersion member 26, 119 and the like), and the outputs/results (e.g., throughput, diffusion length, effective thickness of the primary dispersion member 26, 119, the ratio $L_{eff}/L_D$, and the like) may be in different colors and/or otherwise positioned or set apart from each other.

One preferred and non-limiting embodiment of an interface for use with the modeling system of the present invention is illustrated in FIG. 16, and in this embodiment the interface is in tabbed spreadsheet form, with the main interface on a "main" tab, and other secondary models/determinations (e.g., viscosity, primary dispersion member conductance, and diffusion model) are included on separate tabs. In addition, and in this embodiment, the initial data inputs are in bold/black, the adjustable data inputs are in bold/red, and the outputs/results are in bold/blue. Of course, any of the initial inputs and the adjustable inputs may be obtained or received from other programs, data structures, databases, spreadsheets, and the like. Further, the model may be presented to the user in graphical section-type format and/or on one or more spreadsheets, with corresponding instructions as to what the variables represent, which variables are initially required, which variables are adjustable, and which variables represent the results for use in design processes (for example, see FIG. 16). Also, any of the variables may be linked to and/or associated with a reference manual, a textbook, an explanation, and/or a third-party reference, such that the user can easily understand and/or determine the correct initial inputs and adjustable inputs, as well as the outputs and results. Still further, these models may be in the form of a computer-implemented method, a modeling system and arrangement, a software program and/or programming instructions on a computer-readable medium, and the like.

Accordingly, and in one preferred and non-limiting embodiment, the models and systems described above assist the user in designing and/or configuring an atomic layer deposition apparatus, and in another preferred and non-limiting embodiment, designing and/or configuring an atomic layer deposition apparatus where the effective thickness ($L_{eff}$) of the primary dispersion member 26, 119 is greater than the diffusion length ($L_D$) of the precursor gas.

Figure 10:
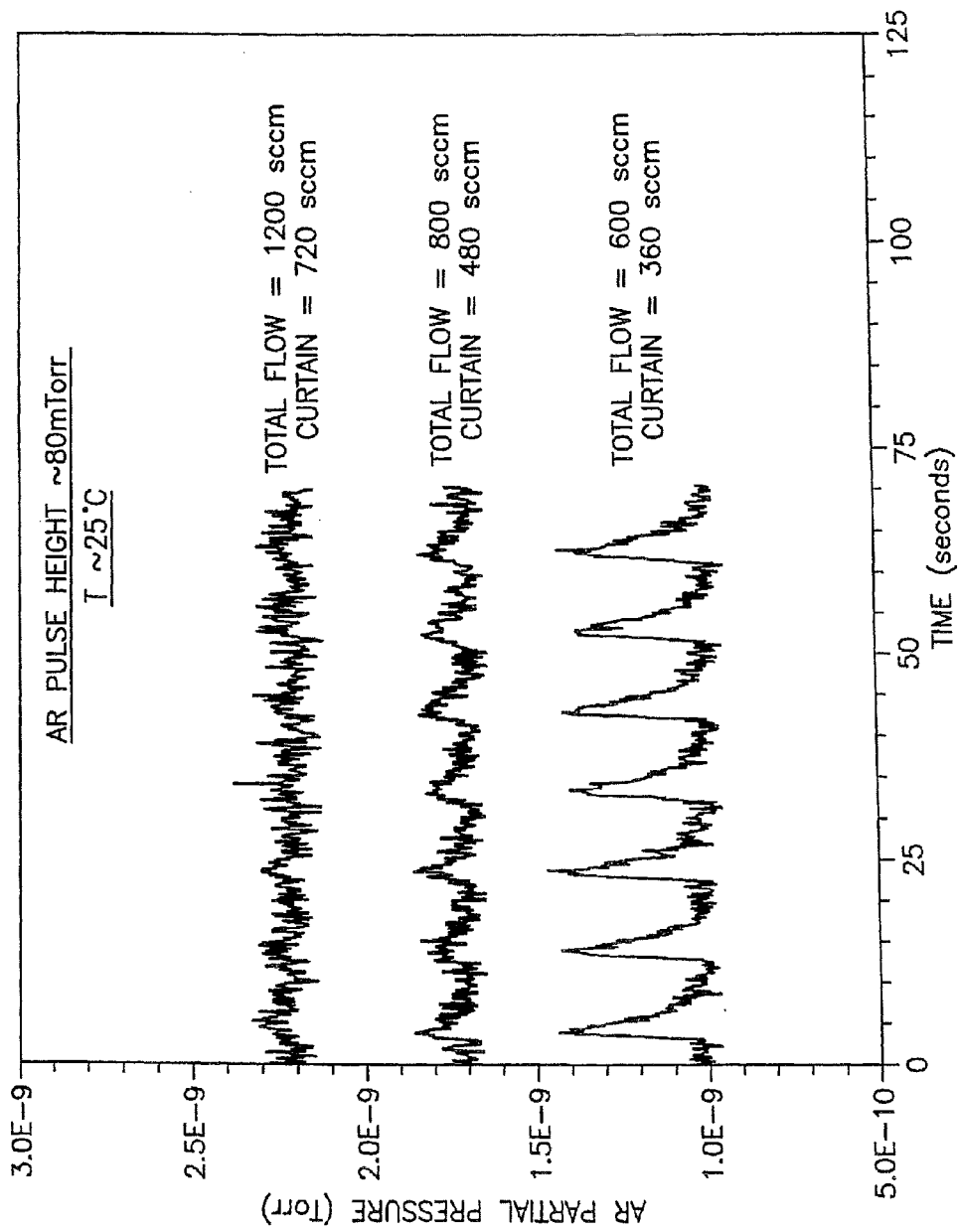
FIG. 10 is a chart illustrating Argon partial pressure over time during operation of one embodiment of an atomic vapor deposition apparatus according to the principles of the present invention.

In one preferred and non-limiting embodiment, typical inactive gas flow ranges from a few hundred to a few thousand sccm (e.g., 200 to 2000 sccm). Baseline pressure $P_2$ within the primary reaction space 107 ranges from a few tenths to a few Torr (e.g., 0.2 to 2 Torr). Precursor pulses $\Delta P_2$ are typically less than 0.100 Torr. To establish a basis for the primary dispersion member 119 design according to a preferred and non-limiting embodiment of the present invention, a differentially-pumped residual gas analyzer (RGA) can be used to monitor precursor partial pressure within the charge volume 118 above the primary dispersion member 119. In one example, the results in FIG. 10 illustrate Ar partial pressure versus time during Ar pulsing at room temperature. Inactive $N_2$ flow through the primary dispersion member 119 ranged from 240 to 720 sccm, and total $N_2$ flow and pressure $P_2$ ranged from 400 to 1200 sccm and 0.350 to 1.050 Torr, respectively. In this example, precursor pulses $\Delta P_2$ were simulated using Ar, where pulse heights were limited to about 0.080 Torr. Inert gas pulse simulations have the advantage of improved RGA detection sensitivity due to limited surface interactions.

In one example, the primary dispersion member 119 nominal thickness (L) was 1.60 cm (0.630 inches), and the distribution of holes 202 were such that number of holes 202 per unit area (n) was constant. Thus, the total number of holes 202=N=(n A), where A=surface area of the primary dispersion member 119 over which the holes are distributed. Holes 202 were circular, and the hole pattern hexagonal, with spacing equal to 7.62 mm (0.300 inches) and diameter (d) equal to 1.32 nm (0.052 inches). Thus, the number of holes per unit area was as follows: n=1.99 holes/cm$^2$. Given the surface area A=349 cm$^2$, the total number of holes was N=695. FIG. 10 illustrates that the Ar pulse signal within the charge volume 118 is at the RGA detection limit at 720 sccm $N_2$ flow. The results in FIG. 11 demonstrate $L_D$ and $L_{eff}$ versus primary dispersion member 119 flow rate, calculated according to the above equations. In general, $L_D$ decreases ($L_D \propto 1/Q$) and $L_{eff}$ increases with increasing primary dispersion member flow. The effective plate thickness $L_{eff}$ increases since the pressure difference $\Delta P=(P_1-P_2)$ increases with primary dispersion member flow.

Figure 12:
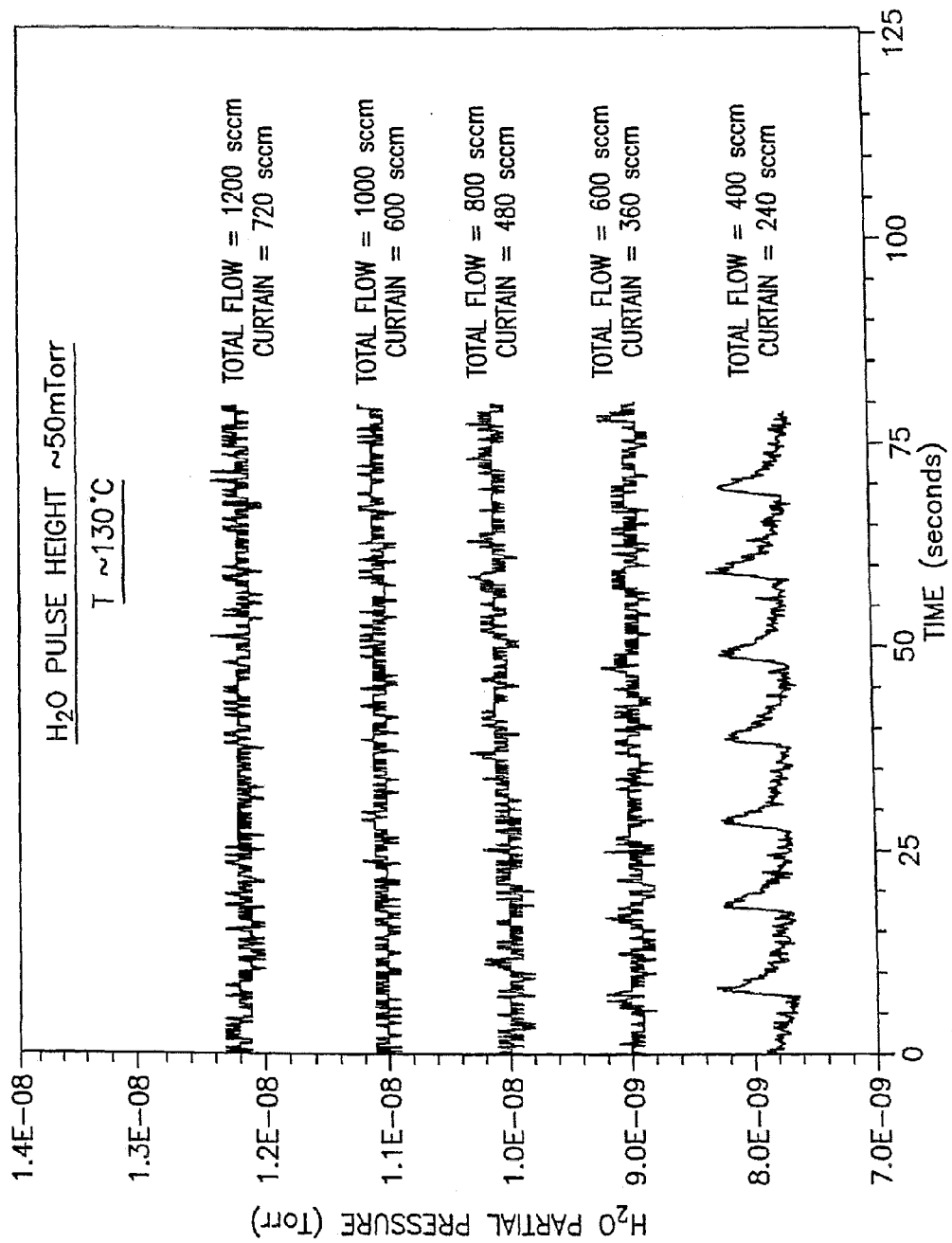
FIG. 12 is a chart illustrating water partial pressure over time during operation of one embodiment of an atomic vapor deposition apparatus according to the principles of the present invention.

The results in FIG. 12 demonstrate $H_2O$ partial pressure versus time within the charge volume 118 during $Al_2O_3$ ALD using trimethylaluminum (TMA) and $H_2O$ precursors at 200° C. substrate temperature. To prevent condensation of precursors on surfaces within the primary reaction space 107, as well as the charge volume 118, surfaces were maintained at approximately 130° C. Similar to the previous embodiment, inactive $N_2$ flow through the primary dispersion member 119 ranged from 240 to 720 sccm, and total $N_2$ flow ranged from 400 to 1200 sccm. However, pressure $P_2$ was higher in this example due to the increased temperature and ranged from approximately 0.400 to 1.225 Torr. The $H_2O$ pulses ($\Delta P_2$) were limited to about 0.05 Torr. FIG. 12 indicates that the $H_2O$ pulse signal within the charge volume 118 is at detection limit of the RGA at 360 sccm $N_2$ flow. The results in FIG. 13 demonstrate $L_D$ and $L_{eff}$ versus primary dispersion member 119 flow rate calculated using the above equations.

Figure 11:
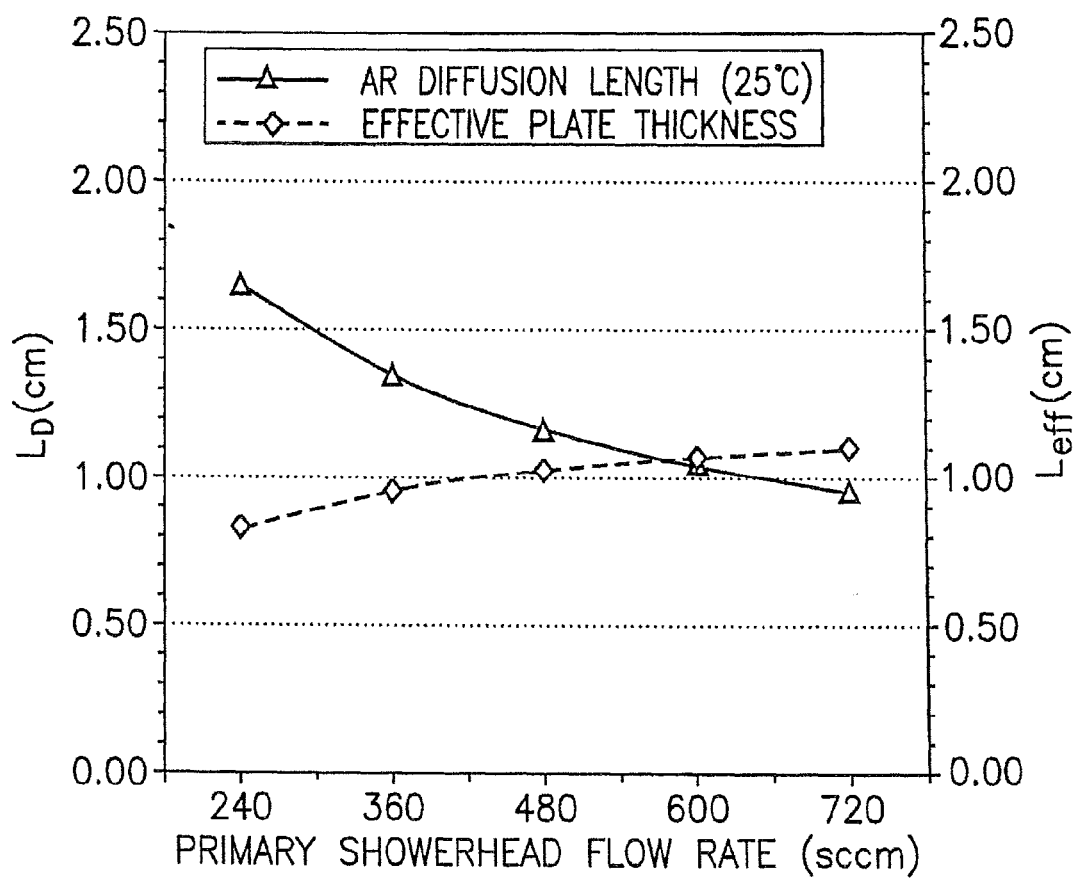
FIG. 11 is a chart illustrating reactant diffusion length for various flow rates during operation of one embodiment of an atomic vapor deposition apparatus according to the principles of the present invention.
Figure 13:
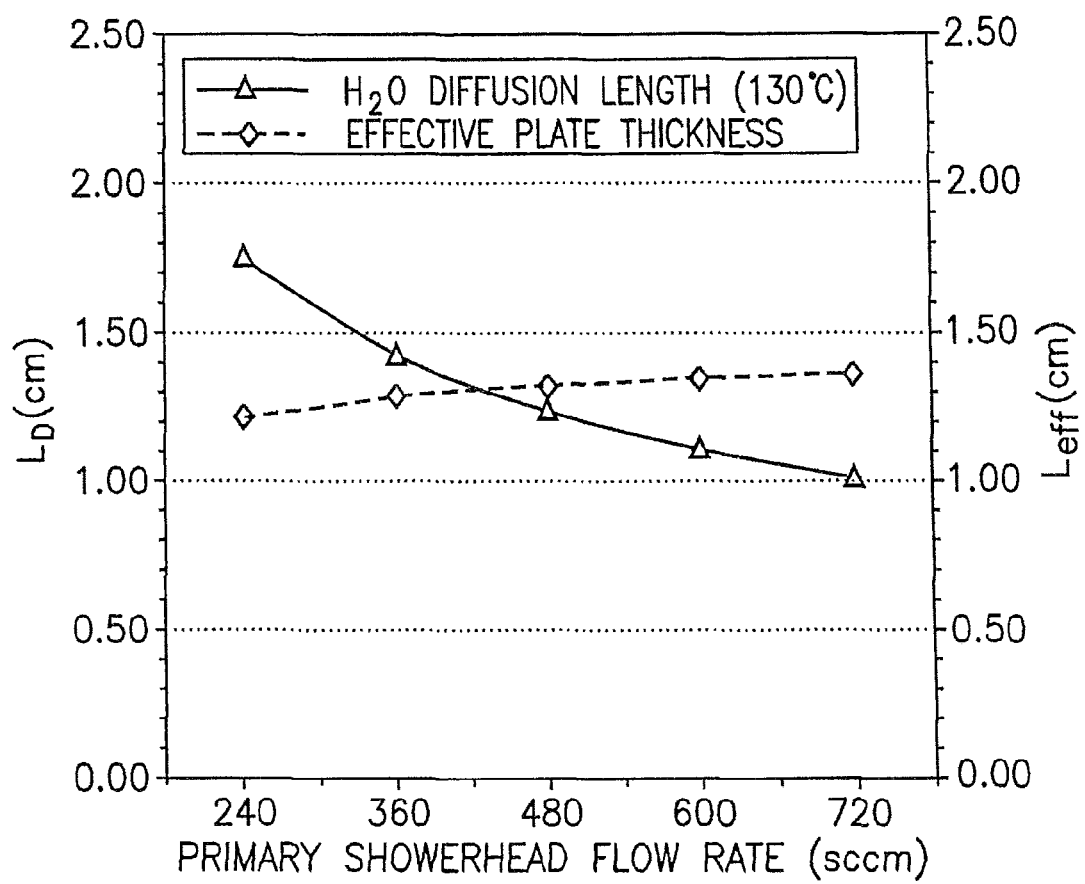
FIG. 13 is a chart illustrating water diffusion length for various flow rates during operation of one embodiment of an atomic vapor deposition apparatus according to the principles of the present invention.
Figure 14:
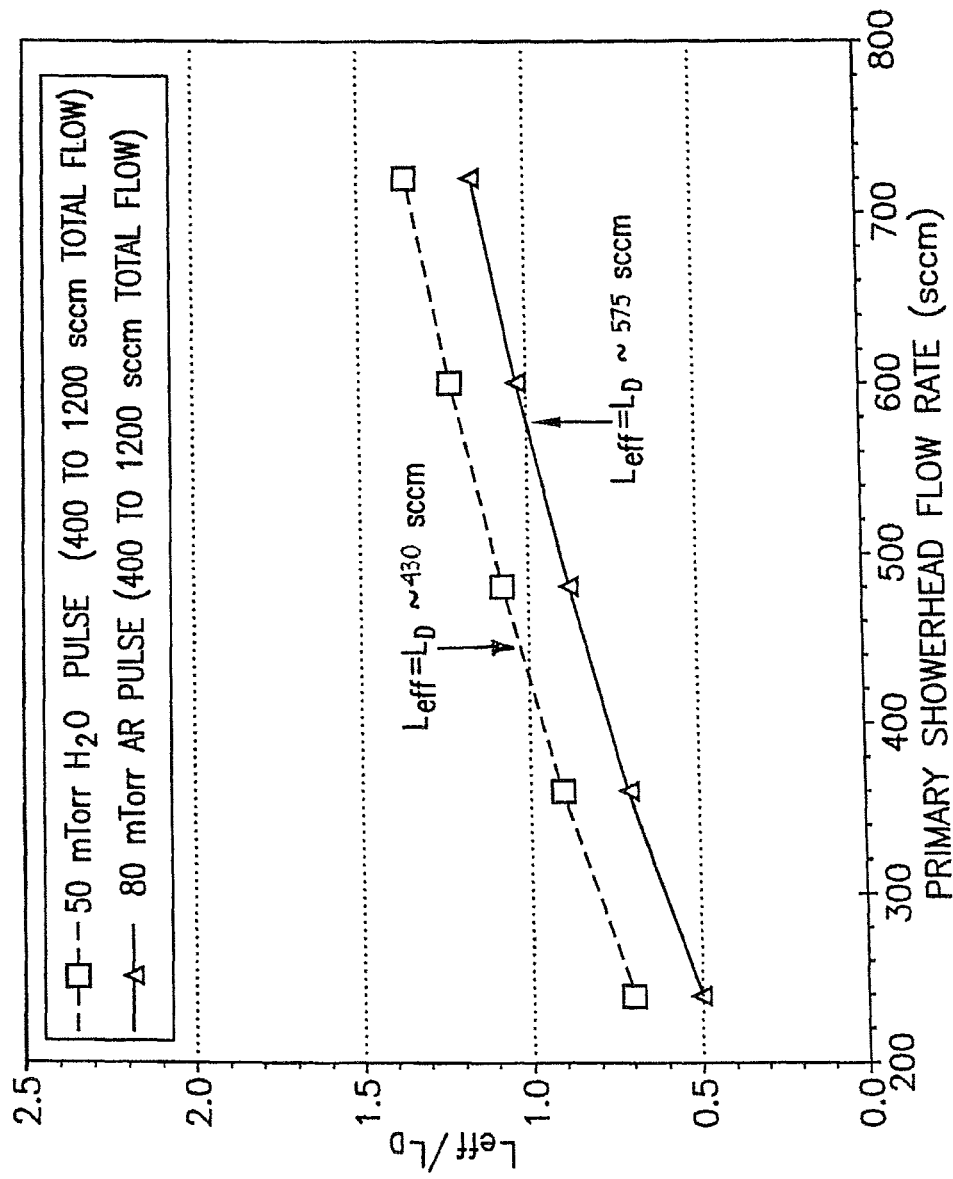
FIG. 14 is a chart illustrating effective thickness/diffusion length ratio for various flow rates during operation of one embodiment of an atomic vapor deposition apparatus according to the principles of the present invention.

The results presented in FIGS. 11 and 13 are summarized in FIG. 14 where the ratio $L_{eff}/L_D$, versus primary dispersion member 119 flow rate, are illustrated. For Ar pulses at 25° C., $L_{eff}/L_D=1$ (i.e., $L_{eff}=L_D$) at about 575 sccm $N_2$ flow. The relatively small Ar pulse signal observed in FIG. 10 at 480 sccm N2 flow corresponds to $L_{eff}/L_D<1$ (i.e., $L_{eff}/L_D=0.88$) as illustrated in FIG. 11 and FIG. 14. At 720 sccm $N_2$ flow, the Ar pulse signal in FIG. 10 is at the RGA detection limit.

In this case, $L_{eff}$ is greater than the diffusion length (i.e., $L_{eff}/L_D=1.16$) as illustrated in FIG. 11 and FIG. 14. For H$_2$O pulses at 130° C., $L_{eff}=L_D$ at about 430 sccm N$_2$ flow. However, the H$_2$O pulse signal is at the RGA detection limit in FIG. 12 at 360 sccm N$_2$ flow, where $L_{eff}$ is less than the diffusion length (i.e., $L_{eff}/L_D=0.90$) as indicated in FIG. 13 and FIG. 14. This is due to the relatively limited RGA detection sensitivity for the H$_2$O precursor as compared to the inactive gas species (i.e., Ar). Based on these experimental results, and in this preferred and non-limiting embodiment, the primary dispersion member 119 effective thickness ($L_{eff}$) should be greater than the precursor diffusion length $L_D$ (i.e., $L_{eff}>L_D$) to prevent precursor diffusion from the primary reaction space 107 into the charge volume 118.

As discussed above, the inactive gas flow through the top-plate 113 surrounds the net gas flow from precursor input adapter 112, and is directed vertically downward along the chamber 103 surfaces. This curtain gas flow from the primary dispersion member 119 is combined with the curtain gas from the analytical ports 121 and the transfer port 304, such that the superposition of flow forms an effective curtain gas barrier to minimize reactant diffusion toward the chamber 103 surfaces within the primary reaction space 107.

In another preferred and non-limiting embodiment, the spacing and distribution of the holes 202 are configured to ensure flow is laminar within the primary reaction space 107, and without generation flow patterns that swirl or re-circulate. In addition, the net distribution of curtain gas flow should preferably minimize reactant diffusion toward the chamber 103 surfaces, including the analytical port 121 and the transfer port 304 surfaces, thereby focusing the concentration of the precursor distribution onto the substrate S surface.

In the above-discussed preferred and non-limiting embodiments, and with reference to FIGS. 10-14, the ALD apparatus 101 included a primary dispersion member 119 with a uniform, hexagonal hole 202 pattern of circular thru-holes, each with a fixed diameter (d). Similarly, the preferred embodiment presented in FIG. 7 includes a uniform distribution of holes 202 with fixed diameter (d), where the number of holes per unit area (n) is constant (i.e., total number of holes N=(n A), where A=surface area of primary dispersion member 119 over which the holes 202 are distributed). However, the hole 202 pattern in FIG. 7 is based on a uniform distribution of holes 202 along concentric rings of equal spacing. This particular hole 202 pattern has the advantage of improved symmetry at the inner and outer boundaries of the primary dispersion member 119 for enhanced performance at these boundaries. In alternate embodiments, non-uniform distributions of holes 202 and/or variable diameters ($d_i$), or cross-sectional areas ($\alpha_i$), can be used to create more complicated flow patterns to further optimize performance. In addition, one or both ends of some or all of the holes may be chamfered or beveled, to alter the flow dynamics.

Figure 15:
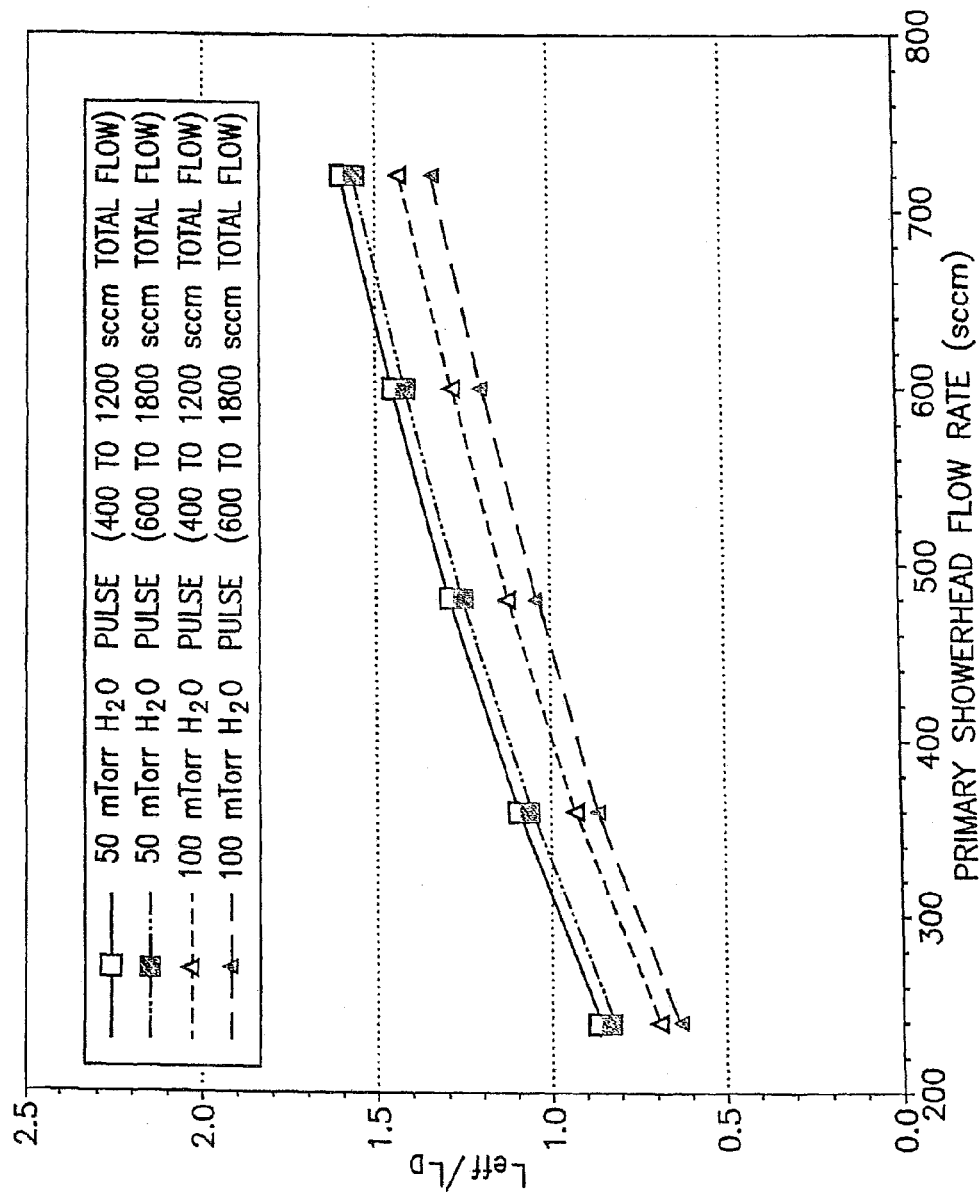
FIG. 15 is a chart illustrating effective thickness/diffusion length ratio for various flow rates during another operation of one embodiment of an atomic vapor deposition apparatus according to the principles of the present invention.

In this preferred and non-limiting embodiment, and for a particular circular hole 202 configuration (N, d) and process flow regime (Q), require that $L_{eff}$ is greater than $L_D$ to prevent diffusion of precursors from the primary reaction space 107 into the charge volume 118. For this preferred embodiment, hole 202 spacing=5.08 mm (or 0.200 inches), hole diameter d=1.27 mm (or 0.050 inches) and the primary dispersion member 119 nominal thickness L=1.6 cm (or 0.63 inches). The results in FIG. 15 illustrate the ratio $L_{eff}/L_D$, versus primary dispersion member 119 flow rate, that were generated using the above equations. These results are based on argon (Ar) inactive gas flow and represent different H$_2$O precursor pulse heights (i.e., $\Delta P_2=0.050$ and 0.100 Torr), as well as different total inactive/Ar gas flow regimes (i.e., pressure regimes) at 130° C. The results in FIG. 15 demonstrate that this particular showerhead design enables a wide range of flow and pressure that satisfy the above requirement (i.e., $L_{eff}>L_D$). Further, and as discussed above, hole 202 may be in a variety of forms and shapes having a cross-sectional area $\alpha$.

In one preferred and non-limiting embodiment, the present invention provides an active precursor focusing functionality. This concept and/or functionality can be achieved by using a centrally-located precursor gas injection port 110, as well as precursor gas injection ports 114, that are positioned above a substrate fixture 104 surface. The combined output from these precursor gas injection ports is surrounded by a distribution of inactive gas (or curtain gas). The purpose of this curtain gas distribution is to create a barrier that limits precursor diffusion toward internal chamber 103 surfaces, and thereby focuses the precursor toward the substrate S. This preferred design improves process performance (e.g., through efficient precursor utilization and subsequent purging between precursor pulse steps), particularly, when additional chamber 103 ports are necessary to enable enhanced system features. E.g., chamber ports for vacuum transfer and in-situ ellipsometry integration.

Accordingly, in one preferred and non-limiting embodiment, the primary dispersion member 119 is primarily responsible for generating the curtain gas distribution that surrounds the output from precursor gas injection ports 110 and 114 (or precursor input adapter 112), and makes precursor focusing functionality possible. The above-discussed design criteria address both steady-state and transient gas flow conditions during ALD processing, where transient flow occurs during precursor pulsing. The relationship between process conditions and precursor focusing, i.e., active precursor focusing, is also considered.

As discussed, a preferred and non-limiting embodiment is based on an annular disk-shaped primary dispersion member 119 with round holes 202 (i.e., the showerhead-type design). In this embodiment, performance is at least partially determined by plate thickness, as well as thru-hole diameter and pattern, where these holes 202 are substantially tubular and the tube length is determined by the member 119 thickness. In another preferred and non-limiting embodiment, the primary dispersion member 119 includes a finite thickness with openings that enable communication with a the primary reaction space 107. The distribution of inactive gas can be modeled and determined by shape, size, and pattern of the openings or holes 202. The inactive gas flow generated is preferably viscous and laminar with virtually zero dead-space volume or pockets. In addition, the backflow of precursors through the primary dispersion member 119 should be prevented during the precursor pulse steps.

As discussed, a curtain gas barrier is established between the output from the centrally-located precursor input adapter 112 and at least some portion of the surrounding chamber 103 internal surface. Again, the primary dispersion member 119 thickness should be finite, and this thickness can be constant or variable (e.g., wedge shaped). The holes 202 can have arbitrary shape, size, and pattern. As discussed above, in one preferred and non-limiting embodiment, the primary dispersion member 119 is an annular disk-shaped member with nominal thickness (L) that completely surrounds the combined output from precursor injection ports 110, 114. In this embodiment, the openings of the holes 202 are round (or circular) with a diameter d, where N holes are arranged in a uniform, concentric ring pattern (with N equal to the total number of holes 202). The general equations above can be used in connection with various hole cross sections by re-defining equations to include cross-sectional area α as opposed to hole diameter d.

Various processing parameters are considered in design of the ALD apparatus 1, 101 of the present invention, including flow, pressure, and pumping speed. For example, the total gas flow in FIG. 1(c) includes two components, namely gas A and gas B. Gas A is purely an inactive gas (e.g., Ar or $N_2$). Similarly, gas B is purely an inactive gas during steady-state flow conditions, but becomes a mixture of inactive and precursor gases during transient precursor pulse steps. In addition, and as illustrated in FIG. 1(e), gas D may comprise solely precursor gas. These flows are independently controlled such that the degree of precursor focusing can be actively controlled. By adding a throttle valve to the foreline, additional active control is made available.

In another preferred and non-limiting embodiment of the active precursor focusing functionality, the total inactive gas flow ($\Phi_{Total}$) through the primary reaction space 107 is defined as follows: $\Phi_{Total}=(\Phi_L+\Phi_P)$, where $\Phi_L$=total inactive gas flow through the lid assembly, and $\Phi_P$=total inactive gas flow through additional chamber 103 ports. The lid assembly 102 includes the precursor input adapter 112 and top-plate 113 subassemblies (as identified in FIGS. 2, 5 and 6). As discussed, chamber 103 may include two analytical ports 121 and a transfer port 304. The total inactive gas flow through the lid assembly includes two main components: $\Phi_L=(\Phi_{L1}+\Phi_{L2})$, where $\Phi_{L1}$=precursor input adapter inactive gas flow, and $\Phi_{L2}$=top-plate inactive gas flow (or flow through the primary dispersion member 119). Flow $\Phi_{L1}$ is the combined inactive gas output from precursor injection ports 110, 114. In this embodiment, uniform inactive gas flow is based on the following distribution: $\Phi_{L1}=(32\%\cdot\Phi_L)$ and $\Phi_{L2}=(68\%\cdot\Phi_L)$, where these percentages are based on lid assembly geometry. Similarly, the total flow through the additional chamber 103 ports is defined as follows: $\Phi_P=(2\cdot\Phi_{P1}+\Phi_{P2})$, where $\Phi_{P1}$=analytical port flow and $\Phi_{P2}$=transfer port flow. In this embodiment, uniform inactive gas flow includes the following: $\Phi_{P1}=(9\%\cdot\Phi_P)$ and $\Phi_{P2}=(82\%\cdot\Phi_P)$, where these percentages are based on port geometry. Again, it is noted that each of these flows are independently controllable.

Port flow $\Phi_P$ is combined with inactive gas flowing down from the top-plate $\Phi_{L2}$ (or primary dispersion member 119), such that the resulting superposition of flow creates an inactive gas barrier that focuses output from the centrally-located precursor input adapter 112 (or precursor injection ports 110, 114) onto the substrate S surface. In another preferred and non-limiting embodiment, $\Phi_P$ is a relatively small percentage of $\Phi_{Total}$ (e.g., <20% $\Phi_{Total}$) to minimize disruption of the lid assembly flow pattern.

Transient precursor pulses, through at least one of the precursor injection ports 110, 114, typically increase the total output from the precursor input adapter 112. This flow increase through the precursor input adapter during precursor pulsing can be compensated for by decreasing $\Phi_{L1}$ (combined inactive gas flow from precursor injection ports 110, 114) and increasing $\Phi_{L2}$ (top-plate, or primary dispersion member 119 inactive gas flow) accordingly. Adjustments can be made to the steady-state inactive gas flow distribution, and/or to the inactive gas flow distribution just before and/or after a precursor pulse step.

Another consideration for the ALD apparatus 1, 101 design of the present invention includes the residence time $t_R=(V/S_{eff})$, where, in this case, V=primary reaction space 107 volume and $S_{eff}$=effective pumping speed. Thus, the residence time of the process gas within primary reaction space 107 can be decreased/increased by: (i) decreasing/increasing the reaction space volume, and/or by (ii) increasing/decreasing the effective pumping speed. Since the primary reaction space 107 volume is constant for a particular apparatus 1, 101 design, the residence time is actively controlled by adjusting the effective pumping speed. This may be accomplished through a control arrangement (not shown) for at least partially controlling the flow of the precursor gas, the inactive gas, and/or the plasma species. In addition, the control arrangement may include a throttle valve, or be configured to at least partially control an effective pumping speed ($S_{eff}$) of a vacuum pump. In one example, the total inactive gas flow through the primary reaction space 107 (i.e., $\Phi_{Total}$) is kept constant and a throttle valve is used to obtain variable conductance between reaction space volume V and the vacuum pump. This throttle valve can therefore be used to control the effective pumping speed and beneficially adjust the residence time. This active control of residence time within the primary reaction space 107 is particularly beneficial when at least one of the precursor gases include plasma species. Furthermore, the relationship between pressure $P_2$ within the primary reaction space 107 and effective pumping speed ($S_{eff}$) can be expressed as follows: $P_2=(Q_{Total}/S_{eff})$, where $Q_{Total}$=total throughput within primary reaction space 107. Since the total throughput $Q_{Total}$ is fixed in this particular example, effective pumping speed can also be controlled to adjust pressure $P_2$ within the primary reaction space 107, where $P_2$ is directly proportional to the residence time. In another example, (a) the effective pumping speed is actively controlled (e.g., by the use of a throttle valve) to adjust residence time; and (b) the total inactive gas flow is actively controlled to maintain constant pressure within the primary reaction space 107. The performance of the primary dispersion member 119 is dependent on the pressure $P_2$ within the primary reaction space as illustrated in FIG. 15. In particular, when flow through the primary dispersion member 119 is held constant, the ratio $L_{eff}/L_D$ decreases with increasing total flow (i.e., increasing pressure $P_2$) within the primary reaction space. This reduction in primary dispersion member 119 performance at increased total flow rates can be eliminated by increasing the effective pumping speed (or decreasing the residence time) and keeping primary reaction pressure $P_2$ constant.

In this manner, the present invention provides a flexible apparatus 1, 101 for atomic layer deposition with enhanced features for advanced, single wafer R&D activities that overcomes various problems cited in the prior art. The present invention provides active precursor focusing functionality, thus enabling improved atomic layer deposition system performance. In some preferred and non-limiting embodiments, enhanced system features include remote plasma, for dual thermal and plasma-enhanced ALD (PEALD) process capability, as well as spectroscopic ellipsometry (SE) for in-situ, real-time process control and monitoring. In addition, cluster tool compatibility enables multi-technique system integration eliminating the need to break vacuum and expose potentially sensitive surfaces and/or layers to atmosphere prior to subsequent processing.

As discussed, the presently-invented ALD apparatus and system provides beneficial active precursor focusing technology to achieve efficient precursor delivery, as well as subsequent purging between precursor pulse steps during ALD processing. Other beneficial features and results include improved precursor utilization efficiency and shorter cycle times. As discussed above, the active precursor focusing feature of the present invention is at least partially based on inactive gas flow that is continuous, viscous, and laminar, where the specific distribution of flow is used to enhance process performance. During precursor pulse steps, the inactive gas flow distribution serves as a carrier gas to help transport precursors to the substrate surface, and as a curtain gas (i.e., a diffusion barrier) to protect surfaces from unwanted precursor exposure. The use of curtain gas diffusion barriers to protect surfaces (e.g., internal plasma tube and SE view-port surfaces) eliminates the need for mechanical valve isolation. This feature is highly desirable since cycling of mechanical valves during process can generate particles that result in unwanted film defects. During the intermediate purge steps, inactive gas flow is used to efficiently remove remaining precursor and/or reaction byproducts from the reaction space.

To eliminate the need for the additional mechanical shutters and valves altogether (as is required in certain existing systems), inactive curtain gas flow through the primary dispersion member 26, 119 is utilized, where this component is preferably designed for ALD processing techniques, and where the design takes into account sequential pulsing of precursors during ALD and the associated increases in pressure within primary reaction space 107. In addition, primary dispersion member 26, 119 flow is combined with inactive curtain gas flow from each of the individual ports (plasma, analytical, transfer port, and the like), such that the superposition of flow makes possible focusing of gases from the precursor input adapter that are flowing downward toward the substrate S. It is also noted that the plasma source may be heated to minimize the condensation of precursors (e.g., water) that could potentially break through the inactive curtain gas diffusion barrier during precursor pulse steps.

Accordingly, the ALD apparatus 1, 101 and system of the present invention leads to robust ALD process performance (e.g., uniformity and cycle time) and enhanced features, such as remote plasma, real-time SE, and cluster tool integration capabilities. As discussed, certain of these benefits are achieved through the use of uniform reactant delivery and by protecting the various ports necessary for integration of these enhanced features through precursor focusing. The inventive active precursor focusing feature is at least partially based on setting up a diffusion barrier that minimizes exposure of process chamber side walls and ports, as well as focusing precursors onto the substrate surface during precursor pulse steps. In addition to uniformity and cycle times, other benefits include the protection of surfaces that enable transmission of radiation (i.e., plasma tube and analytical view ports), efficient reactant utilization, and promoting reactor cleanliness.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. An atomic layer deposition apparatus, comprising:
a chamber having outer and inner surfaces, wherein at least a portion of the inner surfaces define an internal volume of the chamber;
a fixture assembly positioned in the internal volume of the chamber and having a surface configured to hold a substrate within the internal volume of the chamber;
a plurality of gas injection ports configured to facilitate the introduction of gas into the apparatus;
at least one precursor gas arrangement in fluid communication with at least one of the plurality of gas injection ports and configured to introduce precursor gas into the internal volume of the chamber;
at least one inactive gas dispersion arrangement in fluid communication with at least one of the plurality of gas injection ports and configured to introduce inactive gas into the internal volume of the chamber,
wherein the inactive gas dispersion arrangement comprises a charge volume and a primary dispersion member, the primary dispersion member having a nominal thickness (L) and a plurality of holes extending through the primary dispersion member nominal thickness (L), such that at least a portion of the inactive gas introduced to the internal volume of the chamber through the plurality of holes substantially concentrically focuses the precursor gas towards the surface configured to hold the substrate; and
a control arrangement configured to:
control flow of precursor gas into the internal volume of the chamber and control flow of inactive gas into the internal volume of the chamber to control a baseline pressure ($P_2$) within the internal volume of the chamber;
control a flow of the inactive gas into the charge volume to control a pressure within the charge volume($P_1$); and
control a flow of the precursor gas from the at least one precursor gas arrangement into the internal volume of the chamber to control a pressure increase ($\Delta P_2$) within the internal volume of the chamber during the introduction of the precursor gas,
such that an effective thickness (Leff) of the primary dispersion member is greater than a diffusion length ($L_D$) of the precursor gas, wherein Leff=$(1-\Delta P_2/\{P_1-P_2\})$ L.

2. The atomic layer deposition apparatus of claim 1, wherein the primary dispersion member is configured to generate viscous and laminar flow of at least a portion of the inactive gas in at least a portion of the internal volume of the chamber.

3. The atomic layer deposition apparatus of claim 1, wherein the the primary dispersion member nominal thickness (L) is at least one of constant and variable.

4. The atomic layer deposition apparatus of claim 1, wherein the diffusion length ($L_D$) of the precursor gas in one dimension is defined as:

$$L_D^2 = (4D_{12}t_R) = \left(4\alpha D'_{12}\frac{N}{Q}\right)L,$$

where
$D_{12}$=interdiffusion coefficient of two gases at pressure <P>, $\langle P \rangle = (P_1+P_2)/2 =$ average pressure inside of hole volume of, $D'_{12} = D_{12} \langle P \rangle$, $t_R$ = residence time, N = total number of holes, α = cross-sectional area of the hole, Q = throughput = $NQ_H$, $Q_H$ = throughput per hole, and L = nominal primary dispersion member thickness.

5. The atomic layer deposition apparatus of claim 4, wherein the number of holes per unit area of the primary dispersion member is substantially constant.

6. The atomic layer deposition apparatus of claim 1, wherein a cross sectional area of at least a portion of the plurality of holes comprises at least one of the following: a substantially round shape, a substantially oval shape, a substantially square or rectangular shape, a substantially triangular shape, substantially hourglass-shaped, or any combination thereof.

7. The atomic layer deposition apparatus of claim 1, wherein at least a portion of the plurality of holes extending through the primary dispersion member are positioned in a substantially hexagonal pattern.

8. The atomic layer deposition apparatus of claim 1, wherein at least a portion of the plurality of holes extending through the primary dispersion member are positioned in a substantially concentric ring pattern.

9. The atomic layer deposition apparatus of claim 1, wherein the holes extending through the primary dispersion member are spaced and distributed to provide laminar flow of at least a portion of the inactive gas within at least a portion of the internal volume of the chamber.

10. The atomic layer deposition apparatus of claim 1, further comprising at least one additional port configured to facilitate the introduction of gas into the apparatus.

11. The atomic layer deposition apparatus of claim 10, wherein the at least one additional port is at least one of the following: at least one transfer port configured to transfer the substrate into and out of the chamber, at least one analytical port configured to facilitate interaction with the internal volume of the chamber, or any combination thereof.

12. The atomic layer deposition apparatus of claim 10, wherein the at least one additional port is configured to introduce inactive gas into the internal volume of the chamber, wherein the inactive gas contacts and mixes with the inactive gas introduced through the inactive gas dispersion arrangement.

13. The atomic layer deposition apparatus of claim 12, wherein the at least one additional port is configured to introduce the inactive gas into the internal volume of the chamber at an angle with respect to a central longitudinal axis extending through the apparatus.

14. The atomic layer deposition apparatus of claim 1, wherein the inactive gas dispersion arrangement is configured to introduce inactive gas into the internal volume of the chamber, such that an inactive gas barrier is formed and minimizes or eliminates contact between the precursor gas and at least one of the following: at least one inner surface of the chamber, at least one gas injection port, at least one additional port, or any combination thereof.

15. The atomic layer deposition apparatus of claim 1, wherein the at least one precursor gas arrangement comprises a gas dispersion member having a plurality of holes extending therethrough.

16. The atomic layer deposition apparatus of claim 1, wherein the at least one inactive gas dispersion arrangement further comprises an initial gas dispersion member configured to at least partially distribute the flow of inactive gas to the charge volume of the primary gas dispersion member.

17. The atomic layer deposition apparatus of claim 1, wherein at least one of plurality of gas injection ports comprises a plasma port configured to introduce plasma species to the internal volume of the chamber.

18. The atomic layer deposition apparatus of claim 1, further comprising a throttle valve and the control arrangement is further configured to:

at least partially control flow of precursor gas into the internal volume of the chamber and at least partially control flow of the inactive gas into the internal volume of the chamber and control the throttle valve to control a flow of gases from the internal volume of the chamber through the throttle valve to control a baseline pressure ($P_2$) within the internal volume of the chamber.

19. The atomic layer deposition apparatus of claim 1, further comprising at least one pump and the control arrangement is further configured to:

at least partially control flow of precursor gas into the internal volume of the chamber and at least partially control flow of the inactive gas into the internal volume of the chamber and at least partially control an effective pumping speed of the at least one pump to control a flow of gases from the internal volume of the chamber to control a baseline pressure ($P_2$) within the internal volume of the chamber.

20. The atomic layer deposition apparatus of claim 19, wherein the at least one control arrangement is further configured to:

at least partially control flow of precursor gas into the internal volume of the chamber and at least partially control flow of the inactive gas into the internal volume of the chamber and at least partially control an effective pumping speed of the at least one pump to control residence time of gases in the internal volume of the chamber to control a baseline pressure ($P_2$) within the internal volume of the chamber.

21. The atomic layer deposition apparatus of claim 1, wherein the internal volume of the chamber comprises a primary reaction space substantially located in an upper portion of the internal volume and a secondary reaction space substantially located in a lower portion of the internal volume of the chamber.

22. The atomic layer deposition apparatus of claim 1, wherein the primary dispersion member comprises a substantially disk-shaped member and the primary dispersion member nominal thickness (L) comprises the disk-shaped member thickness.

23. The atomic layer deposition apparatus of claim 1, wherein the at least one precursor gas arrangement is supported on an upper surface of the at least one inactive gas dispersion arrangement.

24. The atomic layer deposition apparatus of claim 1, wherein the at least one of the plurality of gas injection ports in fluid communication with the at least one precursor gas arrangement is positioned above the at least one inactive gas dispersion arrangement.

* * * * *

UNITED STATES PATENT AND TRADEMARK OFFICE
CERTIFICATE OF CORRECTION

| | | |
|---|---|---|
| PATENT NO. | : 9,695,510 B2 | Page 1 of 1 |
| APPLICATION NO. | : 13/453488 | |
| DATED | : July 4, 2017 | |
| INVENTOR(S) | : Gilbert Bruce Rayner, Jr. et al. | |

It is certified that error appears in the above-identified patent and that said Letters Patent is hereby corrected as shown below:

In the Claims

Column 26, Lines 27-28, Claim 1, delete "volume($P_1$);" and insert -- volume ($P_1$); --

Column 26, Line 54, Claim 3, delete "the the" and insert -- the --

Column 28, Line 19, Claim 18, delete "($P_2$)within" and insert -- ($P_2$) within --

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*